United States Patent
Kwon et al.

(10) Patent No.: US 9,231,107 B2
(45) Date of Patent: Jan. 5, 2016

(54) THIN FILM TRANSISTOR, METHOD FOR MANUFACTURING THE SAME, AND DISPLAY DEVICE COMPRISING THE SAME

(71) Applicant: LG Display Co., Ltd., Seoul (KR)

(72) Inventors: SeYeoul Kwon, Goyang-si (KR); MinGu Cho, Goyang-si (KR); Sangcheon Youn, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/095,617

(22) Filed: Dec. 3, 2013

(65) Prior Publication Data
US 2014/0159037 A1    Jun. 12, 2014

(30) Foreign Application Priority Data

Dec. 12, 2012 (KR) .................. 10-2012-0144970
Aug. 5, 2013 (KR) .................. 10-2013-0092414

(51) Int. Cl.
*H01L 29/10* (2006.01)
*H01L 29/786* (2006.01)

(52) U.S. Cl.
CPC ...... *H01L 29/78618* (2013.01); *H01L 29/7869* (2013.01); *H01L 29/78696* (2013.01)

(58) Field of Classification Search
USPC .............................. 257/43, E31.074; 438/104
See application file for complete search history.

(56) References Cited

U.S. PATENT DOCUMENTS

| | | | |
|---|---|---|---|
| 8,659,015 B2* | 2/2014 | Yoneda | 257/43 |
| 2007/0148831 A1 | 6/2007 | Nagata et al. | |
| 2008/0191207 A1 | 8/2008 | Nishiura | |
| 2012/0018727 A1 | 1/2012 | Endo et al. | |
| 2012/0175615 A1 | 7/2012 | You et al. | |
| 2012/0223304 A1* | 9/2012 | Yoneda | 257/43 |
| 2014/0035478 A1 | 2/2014 | Kitakado et al. | |
| 2014/0117353 A1* | 5/2014 | Yoneda | 257/43 |

FOREIGN PATENT DOCUMENTS

WO    WO-2012/117936 A1    9/2012

OTHER PUBLICATIONS

PCT International Search Report and Written Opinion for PCT/KR2013/011440, Apr. 28, 2014, 12 Pages.

* cited by examiner

*Primary Examiner* — Telly Green
(74) *Attorney, Agent, or Firm* — Fenwick & West LLP

(57) ABSTRACT

A thin film transistor, a method of manufacturing the thin film transistor, and a display device including the thin film transistor are provided. The thin film transistor comprises an oxide semiconductor layer, a gate electrode, a source electrode and a drain electrode formed on a substrate in a coplanar configuration. A first conductive member is in direct contact with the oxide semiconductor layer and in direct contact with the source electrode. A second conductive member is in direct contact with the oxide semiconductor layer and in direct contact with the drain electrode. The first conductive member and the second conductive member are arranged to decrease resistance between a channel region of the oxide semiconductor layer and the source and drain electrodes.

14 Claims, 22 Drawing Sheets

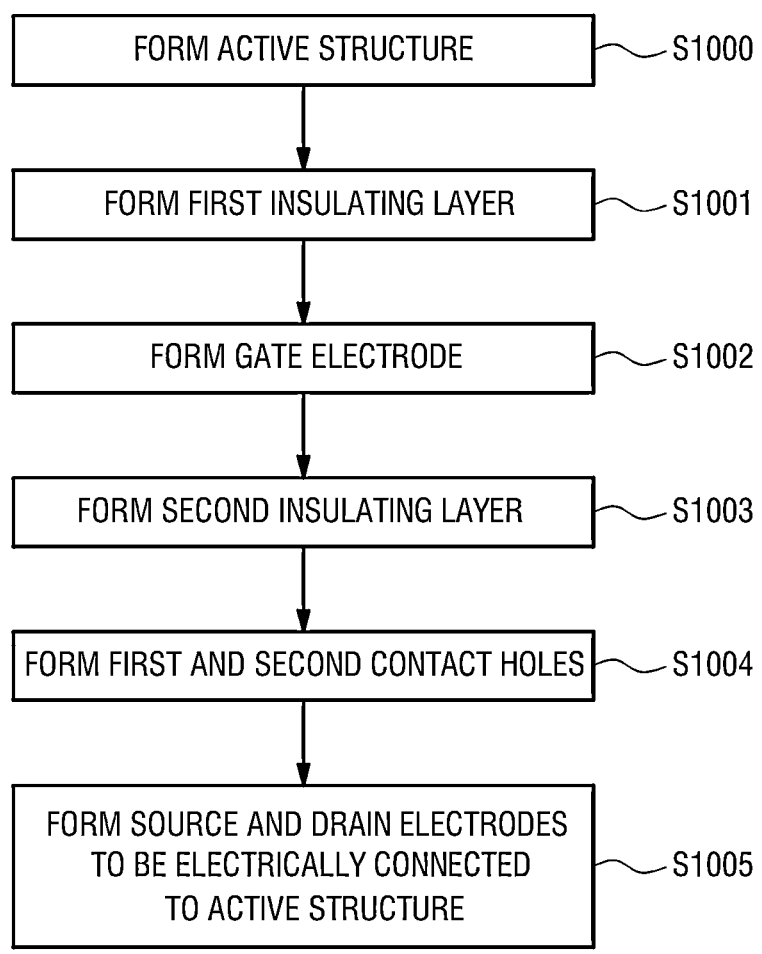

THIN FILM TRANSISTOR, METHOD FOR MANUFACTURING THE SAME, AND DISPLAY DEVICE COMPRISING THE SAME

CROSS-REFERENCE TO RELATED APPLICATIONS

This application claims priority to and the benefit of Korean Patent Application No. 10-2012-0144970, filed on Dec. 12, 2012, the disclosure of which is incorporated herein by reference in its entirety. This application also claims priority to and the benefit of Korean Patent Application No. 10-2013-0092414, filed on Aug. 5, 2013, the disclosure of which is incorporated herein by reference in its entirety.

BACKGROUND

1. Field of the Invention

The present invention relates to a thin film transistor allowing an element characteristic of the thin film transistor having a coplanar structure using an oxide semiconductor to be enhanced, a method of manufacturing the thin film transistor, and a display device including the thin film transistor.

2. Discussion of Related Art

As much attention has been focused recently on information displays and needs for a portable electronic device has been increasing, research and commercialization on a light-weight and thin film type display device and a large-sized high-resolution display device are widely made. In particular, among these various display devices, research on a liquid crystal display (LCD) and an organic light emitting display (OLED) is widely made.

In the LCD and the OLED, a thin film transistor (TFT) is used as a switching element and/or a driving element. The thin film transistor is classified as a thin film transistor using amorphous silicon, a thin film transistor using polysilicon, or a thin film transistor using an oxide semiconductor depending on a material used as an active layer. In the case of the thin film transistor using the polycrystalline silicon, a process of implanting ions is carried out to adjust a resistance of the active layer. An additional mask for defining an ion implantation region may be used, and the ion implantation process is added, thereby causing a disadvantage in terms of process. On the other hand, in the case of the thin film transistor using the oxide semiconductor, the electron mobility increases as compared to that of the thin film transistor using the amorphous silicon, an amount of the leakage current is significantly lower than that of the thin film transistor using the amorphous silicon and the thin film transistor using the polycrystalline silicon, and a high reliability test condition is satisfied. In addition, the thin film transistor using the oxide semiconductor can advantageously ensure that a distribution of threshold voltages is uniform as compared to the thin film transistor using the polycrystalline silicon.

The thin film transistor using the oxide semiconductor may be classified as a thin film transistor having an inverted-staggered structure or a thin film transistor having a coplanar structure depending on positions of an active layer, a gate electrode, a source electrode, and a drain electrode. Since the thin film transistor having the inverted-staggered structure has a high parasitic capacitance between the gate electrode and the source and drain electrodes, it is difficult to apply the thin film transistor having the inverted-staggered structure to a high-resolution display.

Inventors of the present invention have recognized that a high resistance occurred due to an interval of several micrometers between a portion in which the active layer and the source and drain electrodes are in contact with each other and a channel region of the active layer in the thin film transistor having the coplanar structure. To address this problem, the inventors have made the thin film transistor having the improved coplanar structure.

SUMMARY OF THE INVENTION

Accordingly, an aspect of the present disclosure relates an improved thin film transistor (TFT) configured with one or more of conductive members for reducing the electrical resistance between the channel region of the oxide semiconductor layer and the electrodes (e.g., source and drain electrodes) of the TFT.

In one embodiment, a TFT comprises an oxide semiconductor layer, a gate electrode, a source electrode and a drain electrode formed on a substrate in a coplanar configuration. The TFT further comprises a first conductive member and a second conductive member that are in direct contact with the oxide semiconductor layer. The first conductive member is in direct contact with the source electrode on the source regions of the oxide semiconductor layer whereas the second conductive member is in direct contact with the drain electrode on the drain region of the oxide semiconductor layer. The first conductive member and the second conductive member are arranged to decrease resistance between a channel region of the oxide semiconductor layer and the source and drain electrodes.

In one embodiment, an insulating member may be formed on the channel region of the oxide semiconductor layer and between the first and second conductive members. In this configuration, the first conductive member, the insulating member and the second conductive member forms a single layer disposed on the oxide semiconductor layer. In an embodiment, the surface characteristic of the channel region of the oxide semiconductor layer is different from the surface characteristic of the source and drain regions of the oxide semiconductor layer. Also, in an embodiment, the single layer is formed of an oxidizable conductive material, and a portion of the single layer is oxidized so that the oxidized portion forms the insulating member. The first and second conductive members are non-oxidized portions of the single layer, which are positioned at the opposite ends of the oxidized portion. The length of the insulating member in the single layer may vary. In one embodiment, the cross-sectional length of the insulating member is equal to or greater than the cross-sectional length of the gate electrode. Accordingly, the insulating member may extend beyond the overlapping gate electrode such that the gate electrode is arranged not to overlap with the first and the second conductive members.

In one embodiment, the source electrode is in contact with the first conductive member at a first contact area and the first conductive member extends away from the first contact area towards the gate electrode. The drain electrode is in contact with the second conductive member at a second contact area and the second conductive layer extends away from the second contact member towards the gate electrode. In an embodiment, the closest end of the first conductive member is spaced apart from the channel region of the oxide semiconductor layer. Similarly, the closest end of the second conductive member to the gate electrode is spaced apart from the channel region of the oxide semiconductor layer. In an embodiment, the thickness of the oxide semiconductor layer in the channel region is less than or equal to the thickness of the oxide semiconductor layer in the source and drain regions. In this configuration, the space between the first and second conductive members to the channel region of the oxide semiconductor layer may be formed by the differences in the heights of the source and drain regions to the channel region of the oxide semiconductor layer. In an embodiment, the closest end of the first conductive member to the gate electrode is vertically aligned with the first end of the channel region whereas the closest end of the second conductive member to the gate electrode is vertically aligned with the opposite end of the channel region of the oxide semiconductor layer. In an embodiment, the distance between the first and second conducive members is equal to or greater than a length of the gate electrode.

In another embodiment, the first conductive member is in contact with one end side surface of the oxide semiconductor layer and the second conductive member is in contact with an opposing end side surface of the oxide semiconductor layer. The first and the second conductive members disposed at the opposing ends of the oxide semiconductor such that the first conductive member, the oxide semiconductor and the second conductive member are disposed in a same plane. In one embodiment, the first and the second conductive members have the same thickness as the oxide semiconductor layer. In other embodiment, the thickness of the first and the second conductive members may be less than the thickness of the oxide semiconductor layer depending on the desired distance between the gate electrode and the conductive members. Also, in an embodiment, the distance between the first and second conductive members may be equal to or greater than the length of the gate electrode such that the each end of the first and second conductive members towards the oxide semiconductor is vertically aligned with the opposing ends of the gate electrode.

Another aspect of the present disclosure relates to an oxide semiconductor based thin film transistor with an auxiliary member disposed on the oxide semiconductor layer for reducing the electrical resistance between the channel region of the oxide semiconductor layer and the electrodes (e.g., source and drain electrodes) of the TFT.

In one embodiment, a TFT comprises an oxide semiconductor layer, a gate electrode, a source electrode, and a drain electrode formed on the substrate in a coplanar transistor configuration. The TFT further includes an auxiliary member disposed directly on the oxide semiconductor layer. The auxiliary member includes an oxidized portion in between at least a first conductive portion and a second conductive portion. The first conductive portion is in contact with the source electrode whereas the second conductive portion is in contact with the drain electrode. The oxidized portion disposed between the first conductive portion and the second conductive portion has lower electrical conductivity than that of the first and second conductive portions. In an embodiment, at least some portion of the oxidized portion of the auxiliary member is configured to overlap with the gate electrode. In an embodiment, the length of the oxidized portion in the auxiliary member is equal to or greater than the length of the gate electrode. The thickness of the auxiliary member may be from about 30 Å to about 100 Å.

An aspect of the present disclosure also relates to a display device employing a coplanar thin film transistor configured with one or more conductive member for reducing the electrical resistance between the channel region of the oxide semiconductor layer and the electrodes (e.g., source and drain electrodes) of the TFT.

In one embodiment, a display device comprises a substrate, a coplanar thin film transistor, and a display element. The coplanar thin film transistor includes an oxide semiconductor layer, a gate electrode, a source electrode, and a drain electrode formed on the substrate in a coplanar transistor configuration. A first conductive member is in direct contact with the oxide semiconductor layer as well as the source electrode, serving as an extension of the source electrode. Similarly, a second conductive member is in direct contact with the oxide semiconductor layer as well as the drain electrode, thereby serving as an extension of the drain electrode. Also included in the display device is a display element, which is operatively connected to the coplanar thin film transistor. In an embodiment, the display element is an organic light emitting element having an anode, a cathode and an organic light-emitting layer interposed between the anode and the cathode. The anode is electrically connected to the coplanar thin film transistor. In another embodiment, the display element is a liquid crystal display including a pixel electrode, a common electrode and a liquid crystal layer. In this embodiment, the pixel electrode is electrically connected to the coplanar thin film transistor. In another embodiment, the display element comprises a first electrode, a second electrode and an optical medium layer interposed between the first and second electrodes. The optical medium layer includes a fluid and charged particles dispersed in the fluid. The charged particles may have a variety of colors and optical characteristics (e.g., absorbing, reflecting, scattering, etc.). At least one of the first and second electrodes is electrically connected to the coplanar thin film transistor to control the movement of the charged particles.

Yet another aspect of the present disclosure relates to a method of manufacturing a thin film transistor with one or more conductive member for reducing the electrical resistance between the channel region of the oxide semiconductor layer and the electrodes (e.g., source and drain electrodes) of the TFT.

In an embodiment, the method includes forming an oxide semiconductor layer on a substrate; forming a first conductive member and a second conductive member, which are in contact with the oxide semiconductor layer; and forming a gate electrode, a source electrode and a drain electrode in a coplanar transistor configuration with respect to the oxide semiconductor layer. The source electrode is formed to directly contact the first conductive member, and the drain electrode is formed to directly contact the second conductive member.

In one embodiment, the first and second conductive members are formed by oxidizing a portion of an oxidizable conductive layer formed on the oxide semiconductor layer. By oxidizing the portion of the oxidizable conductive layer, an insulating member is formed on a channel region of the oxide semiconductor layer, and the insulating member separates the first conductive member on a source region and the second conductive member on a drain region of the oxide semiconductor layer.

In one embodiment, the first and second conductive members are formed by etching a portion of a conductive layer such that the first conductive member on a source region and the second conductive member on a drain region of the oxide semiconductor layer, which are spaced apart from each other.

In one embodiment, the first and second conductive members are formed by forming the first conductive member in contact with one end side surface of the oxide semiconductor layer and forming the second conductive member in contact with an opposing end side surface of the oxide semiconductor layer.

Additional features of the invention will be set forth in the description, which follows, and in part will be apparent from the description, or may be learned by practice of the invention.

It is to be understood that both the foregoing general description and the following detailed description are exemplary and explanatory and are intended to provide further explanation of the invention as claimed.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which:

FIG. 10 is a flowchart illustrating a method of manufacturing a thin film transistor in accordance with another embodiment of the present invention.

DETAILED DESCRIPTION OF EXEMPLARY EMBODIMENTS

Figure 1A:
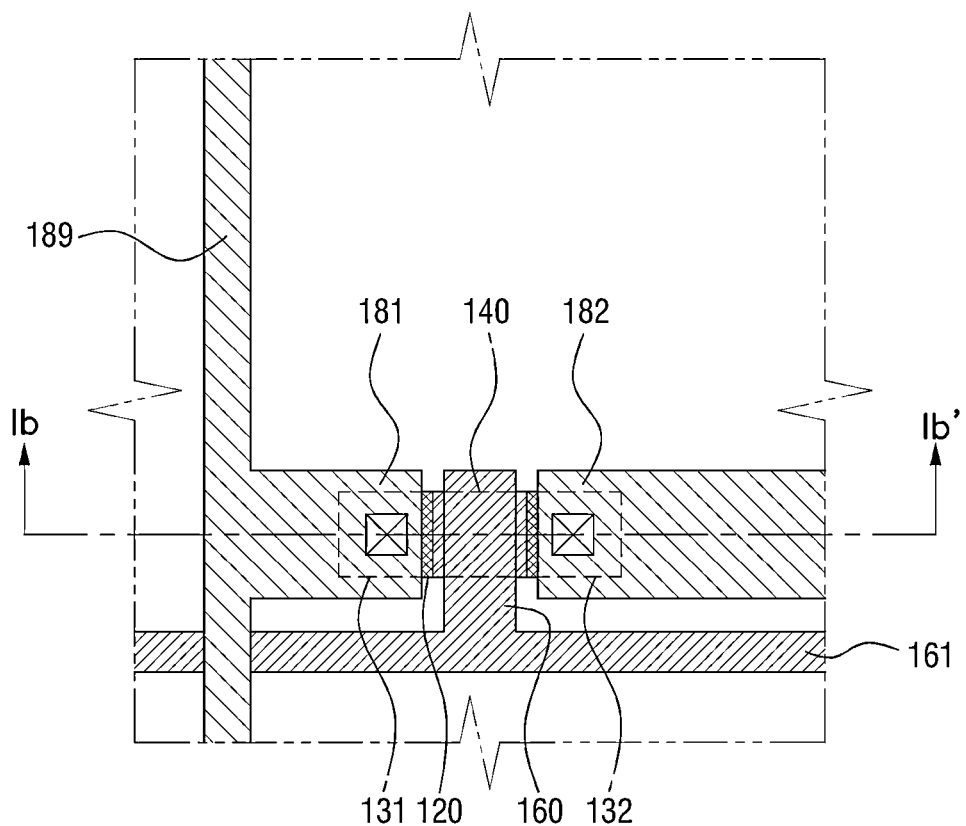
FIG. 1A is a plan view illustrating a thin film transistor in accordance with an embodiment of the present invention.

Exemplary embodiments of the present invention will be described in detail below with reference to the accompanying drawings. While the present invention is shown and described in connection with exemplary embodiments thereof, it will be apparent to those skilled in the art that various modifications can be made without departing from the scope of the invention.

An element or layer formed "on" another element or layer includes a case in which an element is directly formed on another element, and a case in which an element is formed on another element with an additional element or layer formed therebetween.

Although the terms first, second, etc. may be used to describe various elements, it should be understood that these elements are not limited by these terms. These terms are only used to distinguish one element from another. For example, a first element could be termed a second element, and, similarly, a second element could be termed a first element, without departing from the scope of exemplary embodiments.

In this specification, like numbers refer to like elements throughout the description of the drawings.

Sizes and thicknesses of respective elements shown in the drawings are shown for the sake of convenience of description only and are not intended to limit the scope of the present invention.

In this specification, an organic light emitting display device with a top emission mode refers to an organic light emitting display device, wherein light emitted from the organic light emitting diode radiates from an upper portion of the organic light emitting display device. That is, the organic light emitting display device with a top emission mode refers to an organic light emitting display device, wherein light emitted from the organic light emitting diode radiates in a direction of a top surface of a substrate having a thin film transistor formed therein for driving the organic light emitting display device. In this specification, an organic light emitting display device with a bottom emission mode refers to an organic light emitting display device, wherein light emitted from the organic light emitting diode radiates from a lower portion of the organic light emitting display device. That is, the organic light emitting display device with a bottom emission mode refers to an organic light emitting display device, wherein light emitted from the organic light emitting diode radiates in a direction of a bottom surface of a substrate having a thin film transistor formed therein for driving the organic light emitting display device. In this specification, an organic light emitting display device with a dual emission mode refers to an organic light emitting display device, wherein light emitted from the organic light emitting diode radiates from upper and lower portions of the organic light emitting display device. In this specification, in the organic light emitting display devices with top, bottom, and dual emission modes, a thin film transistor, an anode, and a cathode are disposed to optimize a configuration of each emission mode, thereby optimally disposing the thin film transistor without interfering with an emission direction of a light emitting element.

In this specification, a flexible display device refers to a display device endowed with flexibility, and may be used to have the same meaning as a bendable display device, a rollable display device, an unbreakable display device, or a foldable display device. In this specification, a flexible organic light emitting display device is one example of various flexible display devices.

In this specification, a transparent display device refers to a transparent display device that is at least a part of a screen of a display device viewed by a user. In this specification, transparency of the transparent display device refers to a degree of transparency at which a user at least recognizes an object behind a display device. In this specification, the transparent display device includes a display area and a non-display area. The display area is an area on which an image is displayed, and the non-display area is an area on which no image is displayed, such as a bezel area. To maximize transmittance of the display area, the transparent display device is configured to dispose opaque components, such as a battery, a printed circuit board (PCB), and a metal frame, under the non-display area rather than the display area. In this specification, the transparent display device refers to a transparent display device whose transmissivity is, for example, equal to or greater than at least 20%. In this specification, the term "transmissivity" means a value obtained by dividing an intensity of light, which passes through the transparent display device except for light which is incident on a transmissive region of the transparent display device and reflected on the interface between respective layers of the transparent display device, by an intensity of the entire incident light.

In this specification, front and rear surfaces of the transparent display device are defined based on light emitted from the transparent display device. In this specification, the front surface of the transparent display device means a surface on which light from the transparent display device is emitted, and the rear surface of the transparent display device means a surface opposite to the surface on which the light from the transparent display device is emitted.

The features of various exemplary embodiments of the present invention may be partially or entirely bound or combined with each other, and be technically engaged and driven using various methods as apparent to those skilled in the art, and the exemplary embodiments may be independently practiced alone or in combination.

Hereinafter, various exemplary embodiments of the present invention will be described in further detail with reference to the accompanying drawings.

Figure 1B:
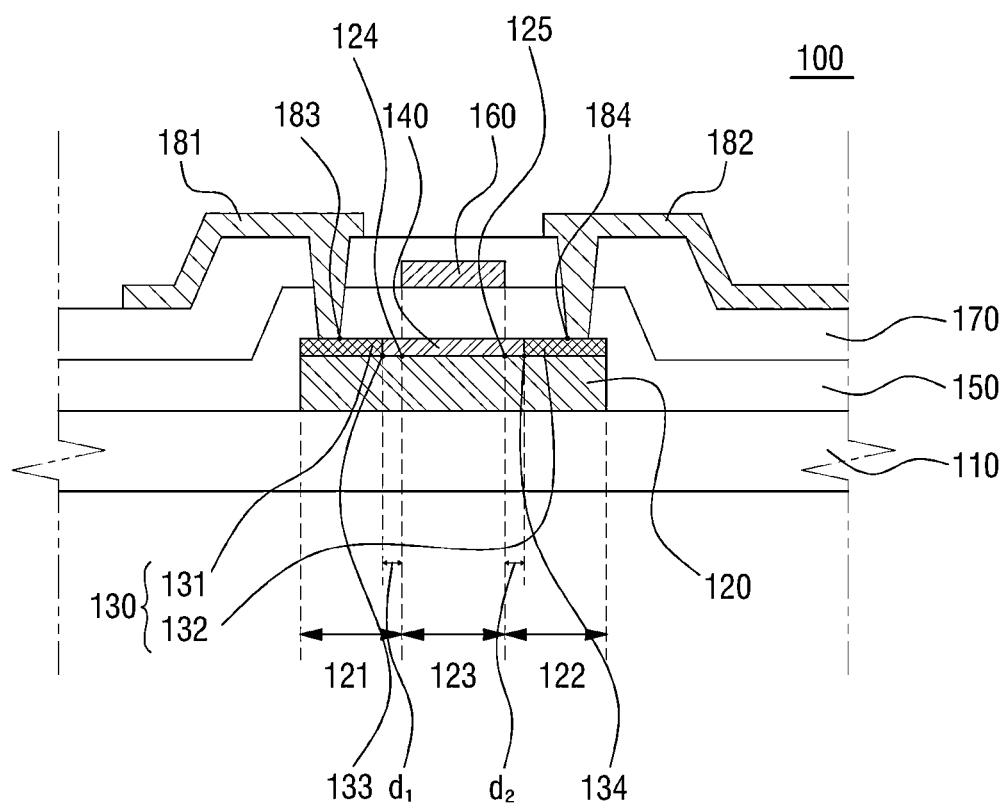
FIG. 1B is a cross-sectional view illustrating a thin film transistor taken along the line Ib-Ib' of FIG. 1A.

FIG. 1A is a plan view illustrating a thin film transistor in accordance with an embodiment of the present invention. FIG. 1B is a cross-sectional view illustrating a thin film transistor taken along the line Ib-Ib' of FIG. 1A. Referring to FIGS. 1A and 1B, a thin film transistor 100 includes a substrate 110, an oxide semiconductor layer 120, a conductive layer 130, a first insulating layer 150, a gate electrode 160, a second insulating layer 170, a source electrode 181, and a drain electrode 182.

The substrate 110 is a member for supporting various elements that may be formed on the substrate 110. The substrate 110 may be referred to as a support substrate, a lower substrate, a thin film transistor, a support member, a lower support member, or the like. The substrate 110 may be formed of an insulating material such as glass or plastic. However, the substrate is not limited thereto and may be formed of various materials.

The substrate 110 may be formed of various materials depending on various applications in which the thin film transistor 100 is used. For example, when the thin film transistor 100 is used in a flexible display device, the substrate 110 may be formed of a soft insulating material. In this case, the available soft insulating material may include polyimide (PI), polyetherimide (PEI), polyethylene terephthalate (PET), polycarbonate (PC), polystyrene (PS), styrene acrylonitrile copolymer (SAN), a silicon-acrylic resin, or the like. In addition, when the thin film transistor 100 is used in transparent display device, the substrate 110 may be formed of a transparent insulating material.

The oxide semiconductor layer 120 is formed on the substrate 110 as an active layer of the thin film transistor 100. When the oxide semiconductor layer 120 is formed as a layer shape, the oxide semiconductor layer 120 may be referred to as an oxide semiconductor layer 120. The oxide semiconductor layer 120 may include a first region 121, a second region 122, and a third region 123, and the first region 121, the second region 122, and the third region 123 may be referred to as a source region, a drain region, and a channel region disposed between the source and drain regions, respectively. It is shown in FIGS. 1A and 1B that the oxide semiconductor 120 is divided into the channel region, the source region, and the drain region for convenience of description. However, the oxide semiconductor 120 is not necessarily limited to the channel region, the source region, and the drain region shown in FIGS. 1A and 1B.

The oxide semiconductor 120 may be formed of various metal oxides. For example, as a constituent material of the oxide semiconductor 120, a four-component metal oxide such as an InSnGaZnO-based material; a three-component metal oxide such as an InGaZnO-based material, an InSnZnO-based material, an InAlZnO-based material, an InHfZnO-based material, a SnGaZnO-based material, an AlGaZnO-based material, or a SnAlZnO-based material, a two-component metal oxide such as an InZnO-based material, a SnZnO-based material, an AlZnO-based material, a ZnMgO-based material, a SnMgO-based material, an InMgO-based material, or an InGaO-based material; an InO-based material; a SnO-based material; a ZnO-based material; or the like may be used. A composition ratio of each element included in each of the listed materials of the oxide semiconductor 120 is not particularly limited and may be variously adjusted. In addition, a thickness of the oxide semiconductor 120 is not particularly limited and may be variously adjusted. The oxide semiconductor 120 may be formed to have a thickness in a range from about 100 Å to about 10000 Å.

The thin film transistor 100 is formed as various shapes by shapes of various elements constituting the thin film transistor 100. For example, the thin film transistor 100 in which the oxide semiconductor 120 constituting the active layer is formed as a bar shape as shown in FIG. 1A, and the thin film transistor in which the oxide semiconductor constituting the active layer is formed as U shape are present. Although not shown in the accompanying drawings herein, the thin film transistor may be formed as various shapes by means of shapes of the active layer, the drain electrode, and the source electrode.

The conductive layer 130 is formed on the oxide semiconductor 120 to be electrically connected to the oxide semiconductor 120. The conductive layer 130 may be referred to a conductive member or a conductive film. Since the conductive layer 130 electrically connects the oxide semiconductor 120 and the source and drain electrodes 181 and 182, it may be referred to as an auxiliary layer or a connecting member. Portions of the conductive layer 130 (i.e. 131, 132) may also be referred to as conductive members.

The conductive layer 130 is formed on the oxide semiconductor 120. The conductive layer 130 may include a first conductive layer 131 formed on the first region 121 of the oxide semiconductor 120 and a second conductive layer 132 formed on the second region 122 of the oxide semiconductor 120. The first conductive layer 131 and the second conductive layer 132 may be formed of the same material but are not in direct contact with each other.

The conductive layer 130 is electrically connected to the oxide semiconductor 120, and is in contact with the source electrode 181 and the drain electrode 182 that will be described later, thereby decreasing a resistance between a channel region of the oxide semiconductor 120 and the source and drain electrodes 181 and 182. Decreasing the resistance between the channel region of the oxide semiconductor 120 and the source and drain electrodes 181 and 182 by means of the conductive layer 130 will be described in more detail later.

The conductive layer 130 may include a conductive material. For example, various conductive metals such as Al, Ti, or the like may be used as the conductive layer 130. The conductive materials of the conductive layer 130 are not limited to metals and may be materials having an electron mobility higher than that of the material of the oxide semiconductor layer 120.

A sputtering process may be employed to form the conductive layer 130 on the substrate 110 or on the oxide semiconductor 120. A thickness of the conductive layer 130 may be variously determined depending on use and process requirements of the thin film transistor 100. When conductive layer 130 is formed with a large thickness, the conductivity of the conductive layer 130 may be enhanced. In this case, when the conductive layer 130 is formed with an excessively large thickness, a distance between the conductive layer 130 and the gate electrode 160 may be decreased to cause a leakage current to occur. In addition, when the thickness of the conductive layer 130 is formed to be large, a time taken for the process to manufacture the conductive layer 130 excessively increases. Accordingly, the thickness of the conductive layer 130 may be properly determined in consideration of the performance, the design structure, the process requirements, or the like of the thin film transistor.

The conductive layer 130 may include an oxidizable conductive material. For example, various oxidizable metals such as Al, Ti, or the like may be formed with proper thicknesses.

A third insulating layer 140 insulating the first conductive layer 131 from the second conductive layer 132 may be formed above the third region 123 of the oxide semiconductor 120 and above the first and second regions 121 and 122 of the oxide semiconductor 120. One side of the third insulating layer 140 is formed on the first region 121 of the oxide semiconductor 120, and the other side of the third insulating layer 140 is formed on the second region 122 of the oxide semiconductor 120. The one side and the other side of the third insulating layer 140 may be lateral portions opposite to each other.

The third insulating layer 140 is an oxide metal and may be an oxide of the oxidizable conductive material constituting the conductive layer 130. As described above, the first conductive layer 131 and the second conductive layer 132 constituting the conductive layer 130 may be formed of the same material, and may be formed in the same process. Accordingly, in order not to have the first conductive layer 131 and the second conductive layer 132 in direct contact with each other, an additional process is required for the region between the first conductive layer 131 and the second conductive layer 132. In the thin film transistor according to an embodiment of the present invention, a portion between the first and second conductive layers 131 and 132, that is, the oxidizable conductive material corresponding to the third region 123 is oxidized to insulate the first conductive layer 131 from the second conductive layer 132. A specific process of forming the third insulating layer 140 will be described in more detail later.

As described above, since the third insulating layer 140 is formed by oxidizing the oxidizable conductive material constituting the conductive layer 130, an oxidization process time of the oxidizable conductive material formed on the third region 123 of the oxide semiconductor 120 excessively increases when the thickness of the conductive layer 130 is excessively large. Accordingly, the conductive layer 130 preferably has a thickness suitable for the oxidization, for example, a thickness in a range from about 30 Å to about 100 Å.

The first insulating layer 150 is formed on the oxide semiconductor 120, the conductive layer 130, and the third insulating layer 140. The first insulating layer 150 insulates the oxide semiconductor 120 and the conductive layer 130 from the gate electrode 160. The first insulating layer 150 may thus be referred to as a gate insulating film. The first insulating layer 150 may be formed of a silicon oxide film, a silicon nitride film, or a stacked layer thereof. However, the first insulating layer is not limited thereto and may be formed of various materials.

The first insulating layer 150 may be formed on an entire surface of the substrate 110 including the oxide semiconductor 120, the conductive layer 130, and the third insulating layer 140. However, since the first insulating layer 150 only has to insulate the oxide semiconductor 120 and the conductive layer 130 from the gate electrode 160, it may be formed on the oxide semiconductor 120 and the conductive layer 130, and in particular, may be formed on third region 123 of the oxide semiconductor 120. When the first insulating layer 150 is formed on an entire surface of the substrate 110, the first insulating layer 150 may be formed to have a contact hole exposing some regions of the conductive layer 130 disposed above the oxide semiconductor 120, and the contact hole may expose some regions of the first conductive layer 131 formed on the source region of the oxide semiconductor 120 and the second conductive layer 132 formed on the drain region of the oxide semiconductor 120. A thickness of the first insulating layer 150 needs to be large enough to insulate the gate electrode 160 from the oxide semiconductor 120. For example, the first insulating layer may be formed with a thickness of about 2000 Å. However, the first insulating layer is not limited thereto.

Since the third insulating layer 140 is formed in the third region 123 of the oxide semiconductor 120, it may at least partially overlap the gate electrode 160. The third insulating layer 140 may thus serve as a double-insulating layer along with the first insulating layer 150. Since a thickness of the double-insulating layer corresponds to a sum of a thickness of the first insulating layer 150 and a thickness of the third insulating layer 140, an insulating property between the oxide semiconductor 120 and the gate electrode 160 may be enhanced. As described above, the third insulating layer 140 formed of the metal oxide, along with the first insulating layer 150, may enhance the insulating property between the oxide semiconductor 120 and the gate electrode 160, thereby decreasing the occurrence of the leakage current.

The gate electrode 160 is formed on the first insulating layer 150. The gate electrode 160 is branched from a gate interconnection 161 and delivers a driving signal delivered via the gate interconnection 161 to the thin film transistor 100. The gate electrode 160 may at least partially overlap the oxide semiconductor 120, and in particular, may overlap the third region 123 as the channel region of the oxide semiconductor 120. The gate electrode 160 may be formed of any one of Mo, Al, Cr, Au, Ti, Ni, Nd, and Cu, or an alloy thereof. However, the gate electrode is not limited thereto and may be formed of various materials. In addition, the gate electrode 160 may be formed of any one selected from the group consisting of Mo, Al, Cr, Au, Ti, Ni, Nd, and Cu, or may be a multi-layer formed of an alloy thereof.

The second insulating layer 170 is formed on the entire surface of the substrate 110 including the gate electrode 160. The second insulating layer 170 may be referred to as an interlayer insulating film. The second insulating layer 170 may be formed of the same material as the first second insulating layer 150, and may be formed of a silicon oxide, a silicon nitride, or a stacked layer thereof. However, the second insulating layer 170 is not limited thereto and may be formed of various materials. The second insulating layer 170 may be formed to have a contact hole exposing some regions of the conductive layer 130, and the contact hole may expose some regions of the first conductive layer 131 formed on the source region of the oxide semiconductor 120 and the second conductive layer 132 formed on the drain region of the oxide semiconductor 120.

A contact hole may be formed in at least one of the first insulating layer 150 and the second insulating layer 170. The contact hole may expose a partial region of the first conductive layer 131 and a partial region of the second conductive layer 132 so that the source electrode 181 and the drain electrode 182 are in contact with the first conductive layer 131 and the second conductive layer 132, respectively. As described above, the first insulating layer 150 is a gate insulating layer, and may be formed on the third region 123 of the oxide semiconductor 120 in which the gate electrode 160 is disposed. When the first insulating layer 150 is formed on the third region 123 of the oxide semiconductor 120, the contact hole may not be formed in the insulating layer 150 and may be formed in the second insulating layer 170. In addition, when the first insulating layer 150 is formed to cover the entire surface of the substrate 110, the contact hole may be formed in both of the first and second insulating layers 150 and 170.

The source electrode 181 and the drain electrode 182 are formed on the second insulating layer 170. The source electrode 181 is branched from a data interconnection 189 and delivers a data signal delivered via the data interconnection 189 to the thin film transistor 100. The source electrode 181 and the drain electrode 182 may be in contact with the first conductive layer 131 and the second conductive layer 132 formed on the oxide semiconductor 120 via the contact hole formed in the first insulating layer 150 and/or the second insulating layer 170, respectively. As a result, the source electrode 181 may be in contact with the first conductive layer 131 positioned in the first region 121 of the oxide semiconductor 120 to be electrically connected to the first region 121 of the oxide semiconductor 120, and the drain electrode 182 may be in contact with the second conductive layer 132 positioned in the second region 122 of the oxide semiconductor 120 to be electrically connected to the second region 122 of the oxide semiconductor 120. The source and drain electrodes 181 and 182 may be formed of any one of Mo, Al, Cr, Au, Ti, Ni, Nd, and Cu, or an alloy thereof. However, the source and drain electrodes are not limited thereto and may be formed of various materials. In addition, the source and drain electrodes 181 and 182 may be formed of any one selected from the group consisting of Mo, Al, Cr, Au, Ti, Ni, Nd, and Cu, or may be a multi-layer formed of an alloy thereof.

The source electrode 181 and the drain electrode 182 are in contact with the first conductive layer 131 and the second conductive layer 132, respectively, thereby decreasing the resistance between the channel region of the oxide semiconductor 120 and the source and drain electrodes 181 and 182. When the thin film transistor 100 is driven, electrons move between the source electrode 181 and the channel region of the oxide semiconductor 120 and between the drain electrode 182 and the channel region of the oxide semiconductor 120, and the characteristics of the thin film transistor 100 is enhanced when the resistance of the region in which the electrons move is smaller. An electron movement distance between the source electrode 181 and the channel region of the oxide semiconductor 120 corresponds to a distance between an end portion 183 of the source electrode 181 and the source electrode-side end portion 124 of the channel region of the oxide semiconductor 120. When the conductive layer 130 is not used, the source electrode 181 is in direct contact with the oxide semiconductor 120, and electrons must travel a long distance through the oxide semiconductor 120 in order to move from the source electrode 181 to the channel region of the oxide semiconductor 120. However, the conductive layer 130 in the thin film transistor 100 according to an embodiment of the present invention, the space between the source electrode 181 and the channel region of the oxide semiconductor 120 now includes both the first conductive layer 131 as well as a portion of the gate oxide 120. This is because the first conductive layer 131 extends away, from a contact area where the source electrode 181 contacts the first conductive layer 131, towards the gate electrode 160, thereby filling part of the space between the source electrode 181 and the channel region 123. As a result, electrons only need to move through a short portion of the gate oxide 120 that is between the end portion 133 of the first conductive layer 131 and the source electrode-side end portion 124 of the channel region of the oxide semiconductor 120. Accordingly, since the distance by which the electrons move on the oxide semiconductor 120 is shortened as compared to the case of not using the conductive layer 130, the resistance between the source electrode 181 and the channel region of the oxide semiconductor 120 may be relatively decreased, and the characteristics of the thin film transistor 100 may also be enhanced. In addition, when the conductive layer 130 is used, since the resistance between the drain electrode 182 and the channel region of the oxide semiconductor 120 is relatively decreased for the same reason as described with reference to the source electrode 181, the characteristics of the thin film transistor 100 may also be enhanced.

Although it is shown in FIG. 1B that the end portion 133 of the first conductive layer 131 in contact with the source electrode 181 and toward the channel region of the oxide semiconductor 120 and the source electrode-side end portion 124 of the channel region of the oxide semiconductor 120 are spaced from each other, the channel region of the oxide semiconductor 120 and the third insulating layer 140 may completely overlap each other so that the end portion 133 of the first conductive layer 131 in contact with the source electrode 181 and toward the channel region of the oxide semiconductor 120 may be identical to the source electrode-side end portion 124 of the channel region of the oxide semiconductor 120. In this case, since the end portion 133 of the first conductive layer 131 in contact with the source electrode 181 and toward the channel region of the oxide semiconductor 120 is in contact with the channel region of the oxide semiconductor 120 and the space in which the electrons move, the space between the source electrode 181 and the channel region of the oxide semiconductor 120 corresponds to the first conductive layer 131 that is completely conductive, the resistance between source electrode 181 and the channel region of the oxide semiconductor 120 may be relatively decreased and the characteristics of the thin film transistor 100 may also be enhanced. In addition, it is shown in FIG. 1B that an end portion 134 of the second conductive layer 132 in contact with the drain electrode 182 and toward the channel region of the oxide semiconductor 120 and the drain electrode-side end portion 125 of the channel region of the oxide semiconductor 120 are spaced from each other. However, the end portion 134 of the second conductive layer 132 in contact with the drain electrode 182 toward the channel region of the oxide semiconductor 120 may be in contact with the channel region of the oxide semiconductor 120, and the resistance between the drain electrode 182 and the channel region of the oxide semiconductor 120 may thus be relatively decreased and the characteristics of the thin film transistor 100 may also be enhanced.

A distance $d_1$ from the end portion 133 of the first conductive layer 131 in contact with the source electrode 181 and toward the channel region of the oxide semiconductor 120 to the source electrode-side end portion 124 of the channel region of the oxide semiconductor 120 may be equal to or less than a contact distance. In addition, a distance $d_2$ from the end portion 134 of the second conductive layer 132 in contact with the drain electrode 182 and toward the channel region of the oxide semiconductor 120 to the drain electrode-side end portion 125 of the channel region of the oxide semiconductor 120 may also be equal to or less than the contact distance. The contact distance as used herein is a distance for normal driving of the thin film transistor 100, and indicates a shortest distance in the oxide semiconductor 120 in which electrons can move between the conductive layer 130 and the channel region of the oxide semiconductor 120. For example, the contact distance may be defined to be about 500 Å or less.

The thin film transistor may be classified as an inverted-staggered structure or a coplanar structure depending on positions of the active layer, the gate electrode, the source electrode, and the drain electrode. The thin film transistor of the coplanar structure is a thin film transistor having a structure in which not only the source and drain electrodes but also the gate electrode are positioned above the active layer and all of the source electrode, the drain electrode, and the gate electrode are thus positioned on the same side with the active layer being a reference therebetween, and may be referred to as a top gate thin film transistor. The thin film transistor of the inverted-staggered structure is a thin film transistor having a structure in which the source and drain electrodes are positioned above the active layer and the gate electrode is positioned below the active layer and the source and drain electrodes are positioned on the opposite side as the gate electrode with the active layer being a reference therebetween, and may be referred to as a bottom gate thin film transistor. In the case of the thin film transistor having the inverted-staggered structure, a parasitic capacitance between the gate electrode and the source and drain electrodes is significantly high and it is thus difficult to apply the thin film transistor having the inverted-staggered structure to a high-resolution display. However, in the case of the thin film transistor having the coplanar structure such as the thin film transistor according to an embodiment of the present invention, the parasitic capacitance between the gate electrode and the source and drain electrodes is relatively low, and it is thus possible to readily apply the thin film transistor having the coplanar structure to the high-resolution display. It is assumed herein that the thin film transistor is the thin film transistor having the coplanar structure.

Figure 2A:
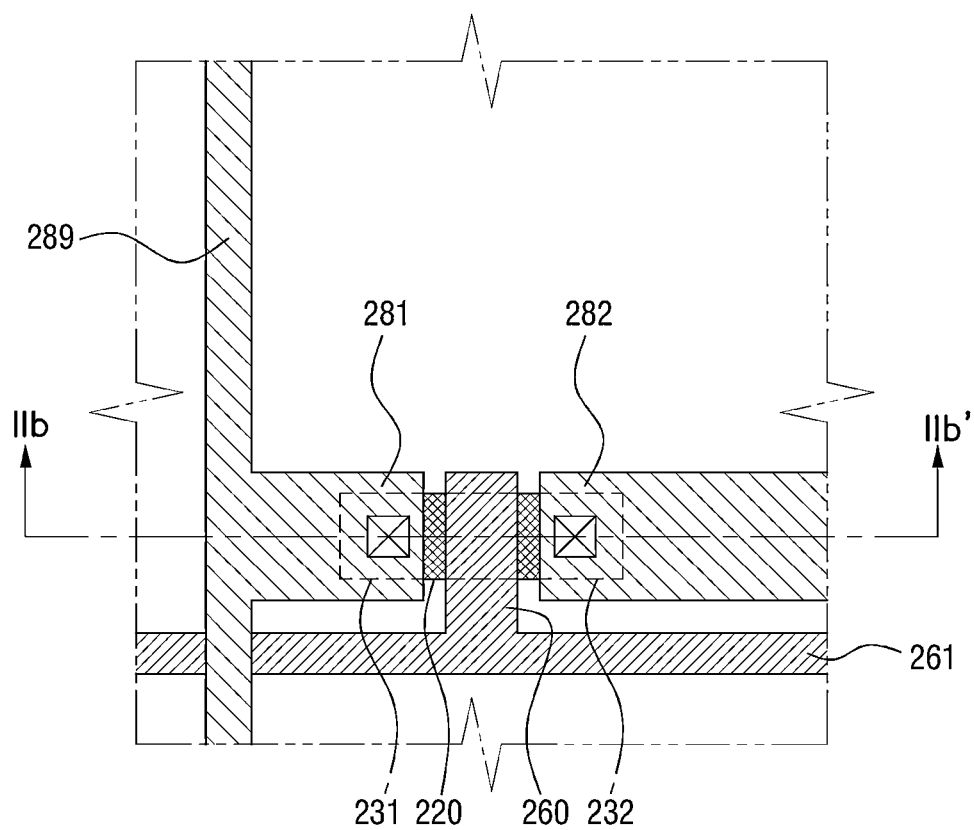
FIG. 2A is a plan view illustrating a thin film transistor in accordance with another embodiment of the present invention.
Figure 2B:
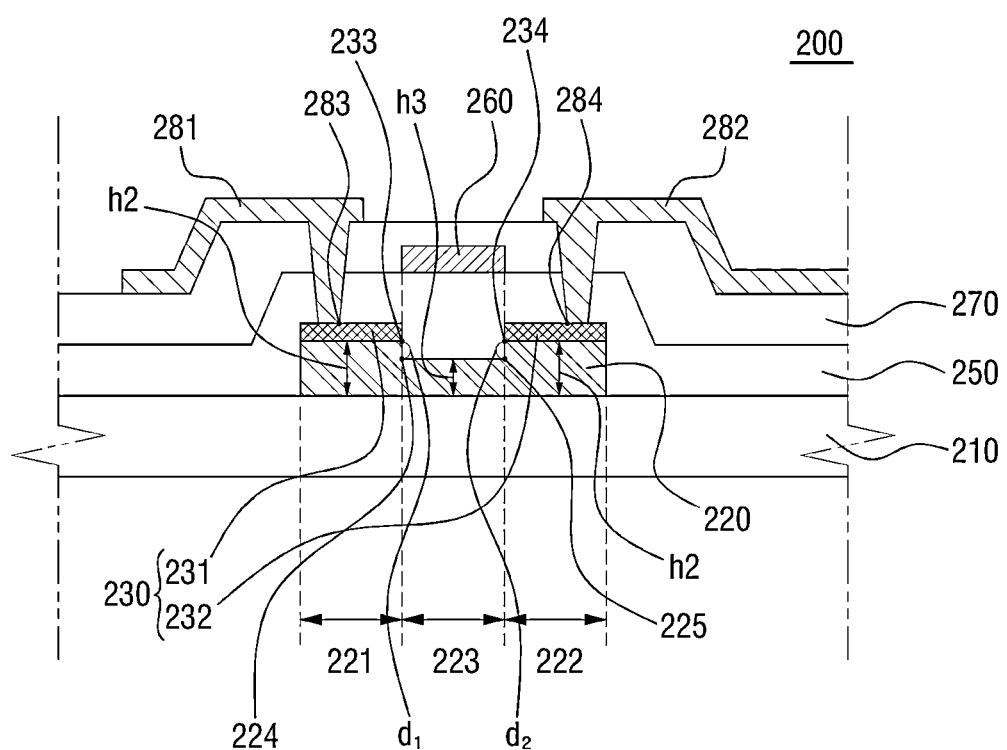
FIG. 2B is a cross-sectional view illustrating a thin film transistor taken along the line IIb-IIb' of FIG. 2A.

FIG. 2A is a plan view illustrating a thin film transistor in accordance with another embodiment of the present invention. FIG. 2B is a cross-sectional view illustrating a thin film transistor taken along the line IIb-IIb' of FIG. 2A. Since a substrate 210, a first insulating layer 250, a gate electrode 260, a gate interconnection 261, a second insulating layer 270, a source electrode 281, a drain electrode 282, and a data interconnection 289 are substantially the same as the substrate 110, the first insulating layer 150, the gate electrode 160, the gate interconnection 161, the second insulating layer 170, the source electrode 181, the drain electrode 182, and the data interconnection 189 of FIGS. 1A and 1B, an overlapping description thereof will be omitted.

The conductive layer 230 is formed above the oxide semiconductor 220. The conductive layer 230 may include a first conductive layer 231 formed on the first region 221 of the oxide semiconductor 220 and a second conductive layer 232 formed on the second region 222 of the oxide semiconductor 220. The first conductive layer 231 and the second conductive layer 232 may be formed of the same material but is electrically isolated from each other.

The conductive layer 230 is electrically connected to the oxide semiconductor 220, and is in contact with the source electrode 281 and the drain electrode 282 to decrease a resistance between the oxide semiconductor 220 and the source and drain electrodes 281 and 282.

The conductive layer 230 may include a transparent conductive material, and may include a material having a substantially similar etching characteristic to that of the oxide semiconductor 220. The transparent conductive material that may be included in the conductive layer 230 may include, for example, a transparent conductive oxide (TCO), particularly, an indium tin oxide (ITO), an indium zinc oxide (IZO), or the like.

The first conductive layer 231 and the second conductive layer 232 may be formed by etching the conductive layer 230. When the conductive layer 230 formed on the third region 223 of the oxide semiconductor 220 is etched after the transparent conductive material is formed on an entire surface of the oxide semiconductor 220, the first conductive layer 231 and the second conductive layer 232 of the conductive layer 230 may not be in direct contact with each other. A specific process of forming the first conductive layer 231 and the second conductive layer 232 will be described later.

A height $h_3$ of the oxide semiconductor 220 in the third region 223 may be equal to or less than heights $h_1$ and $h_2$ of the oxide semiconductor 220 in the first and second regions 221 and 222. As described above, the conductive layer 230 formed on the third region 223 of the oxide semiconductor 220 may be etched in order to electrically isolate the first conductive layer 231 from the second conductive layer 232. However, since etching characteristics of the materials constituting the oxide semiconductor 220 and the conductive layer 230 are substantially similar to each other, accurately removing only the conductive layer 230 up to the boundary surface between the conductive layer 230 and the oxide semiconductor 220 is a significantly difficult process. The height $h_3$ of the oxide semiconductor 220 in the third region 223 may thus be equal to or less than the heights $h_1$ and $h_2$ of the oxide semiconductor 220 in the first and second regions 221 and 222.

The surface characteristic of the third region 223 of the oxide semiconductor 220 may be different from those of the first region 221 and the second region 222 of the oxide semiconductor 220. The first region 221 and the second region 222 of the oxide semiconductor 220 correspond to regions in which the conductive layer 230 is formed after the oxide semiconductor 220 is formed. Accordingly, surfaces of the first region 221 and the second region 222 of the oxide semiconductor 220, that is, upper surfaces of the first region 221 and the second region 222 of the oxide semiconductor 220 are surfaces to which the etching process is not applied. The third region 223 of the oxide semiconductor 220 is a region in which the conductive layer 230 is removed after the oxide semiconductor 220 is formed and the conductive layer 230 is formed. Accordingly, the surface of the third region 223 of the oxide semiconductor 220, that is, an upper surface of the third region 223 of the oxide semiconductor 220 is a surface to which the etching process is applied. The surface characteristics of the third region 223 of the oxide semiconductor 220 may thus be different from those of the first region 221 and the second region 222 of the oxide semiconductor 220 in terms of a roughness, a molecular or atomic bonding force, a molecular composition ratio, or the like.

The source electrode 281 and the drain electrode 282 are in contact with the first conductive layer 231 and the second conductive layer 232, respectively, thereby decreasing the resistance between the channel region of the oxide semiconductor 220 and the source and drain electrodes 281 and 282. When the thin film transistor 200 is driven, electrons between the source electrode 281 and the channel region of the oxide semiconductor 220 and between the drain electrode 282 the channel region of the oxide semiconductor 220 move, and the characteristics of the thin film transistor 200 is enhanced when the resistance of the region in which the electrons move is smaller. A distance between the source electrode 281 and the channel region of the oxide semiconductor 220, that is, an electron movement distance corresponds to a distance between the end portion 283 of the source electrode 281 and the source electrode-side end portion 224 of the channel region of the oxide semiconductor 220. When the conductive layer 230 is not used, the source electrode 281 is in direct contact with the oxide semiconductor 220, and electrons must travel a long distance through the oxide semiconductor 220 in order to move from the source electrode 281 to the channel region of the oxide semiconductor 220. However, when the conductive layer 230 is used as in the thin film transistor 200 according to an embodiment of the present invention, the space between the source electrode 281 and the channel region of the oxide semiconductor 220 now includes both the first conductive layer 231 as well as a portion of the gate oxide 220. As a result, electrons only need to move through a short portion of the gate oxide 220 that is between the end portion 233 of the first conductive layer 231 and the source electrode-side end portion 224 of the channel region of the oxide semiconductor 220. Accordingly, since the distance by which the electrons move on the oxide semiconductor 220 is shortened as compared to the case of not using the conductive layer 230, the resistance between the source electrode 281 and the channel region of the oxide semiconductor 220 may be relatively decreased, and the characteristics of the thin film transistor 200 may also be enhanced. In addition, when the conductive layer 230 is used, since the resistance between the drain electrode 282 and the channel region of the oxide semiconductor 220 is relatively decreased for the same reason as described with reference to the source electrode 281, the characteristics of the thin film transistor 200 may also be enhanced.

A distance $d_1$ from the end portion 233 of the first conductive layer 231 in contact with the source electrode 281 and toward the channel region of the oxide semiconductor 220 to the source electrode-side end portion 224 of the channel region of the oxide semiconductor 220 may be equal to or less than the contact distance. In addition, a distance $d_2$ from the end portion 234 of the second conductive layer 232 in contact with the drain electrode 282 and toward the channel region of the oxide semiconductor 220 to the drain electrode-side end portion 225 of the channel region of the oxide semiconductor 220 may also be equal to or less than the contact distance. The distance $d_1$ may be zero such that the end portion 233 of the first conductive layer 231 is aligned with the end 224 of the channel region. The distance $d_2$ may similarly be zero such that the end portion 234 of the second conductive layer 232 is aligned with the end 225 of the channel region.

Figure 3A:
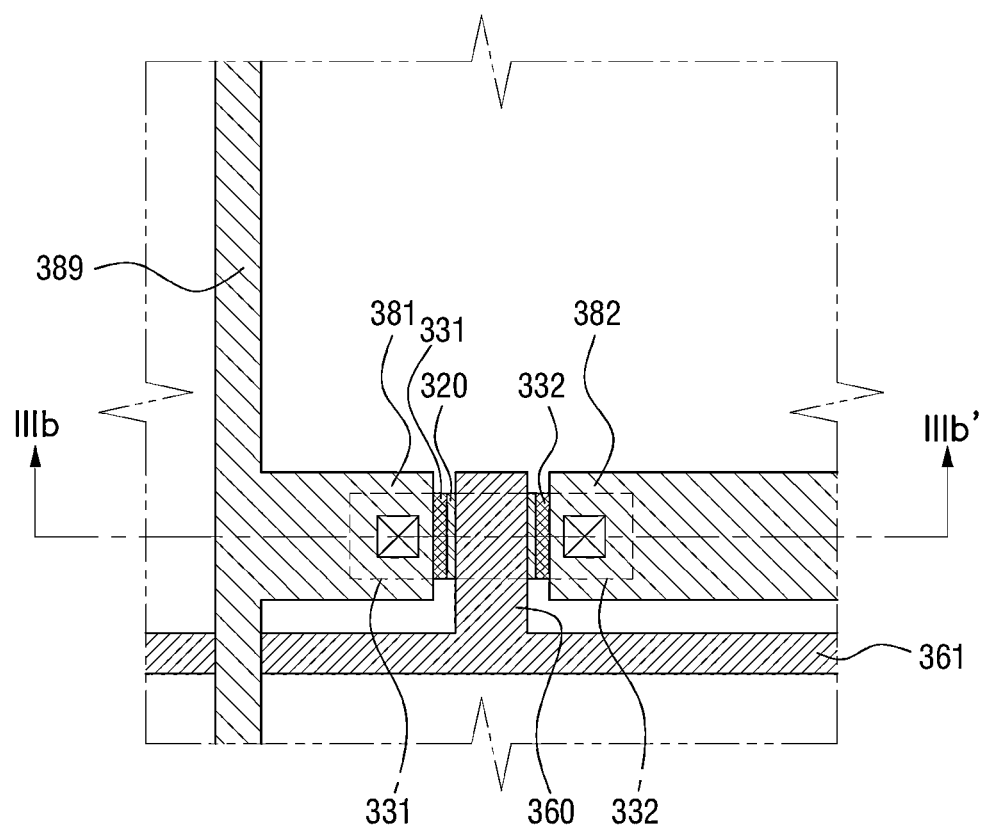
FIG. 3A is a plan view illustrating a thin film transistor in accordance with yet another embodiment of the present invention.
Figure 3B:
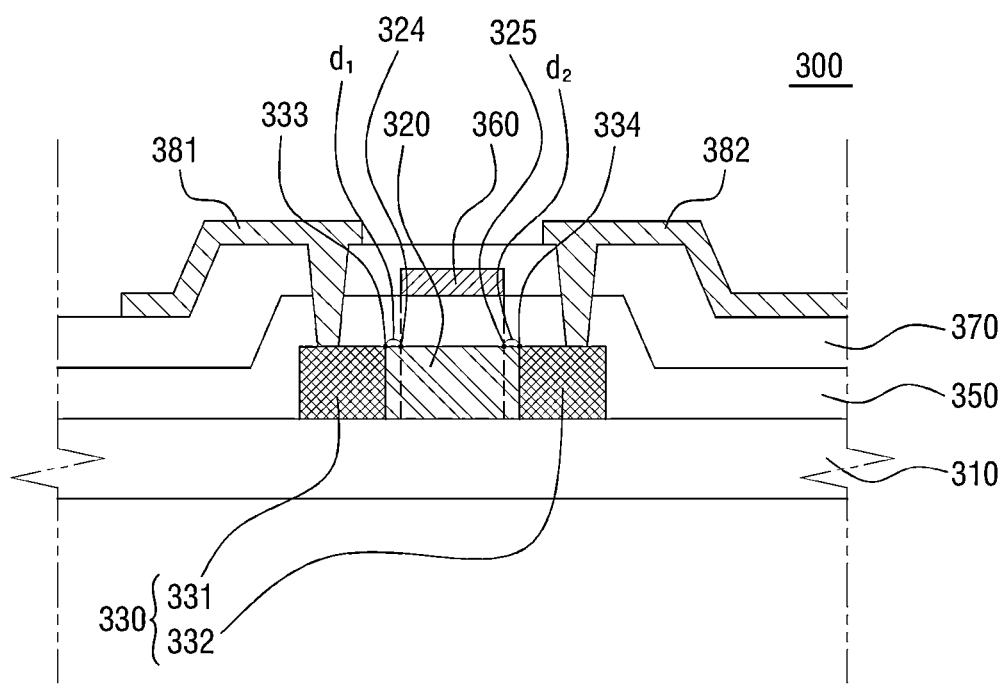
FIG. 3B is a cross-sectional view illustrating a thin film transistor taken along the line IIIb-IIIb' of FIG. 3A.

FIG. 3A is a plan view illustrating a thin film transistor in accordance with yet another embodiment of the present invention. FIG. 3B is a cross-sectional view illustrating a thin film transistor taken along the line IIIb-IIIb' of FIG. 3A. Since a substrate 310, an oxide semiconductor 320, a first insulating layer 350, a gate electrode 360, a second insulating layer 370, a source electrode 381, a drain electrode 382, a gate interconnection 361, and a data interconnection 389 are substantially the same as the substrate 110, the oxide semiconductor 120, the conductive layer 130, the first insulating layer 150, the gate electrode 160, the second insulating layer 170, the source electrode 181, the drain electrode 182, the gate interconnection 161, and the data interconnection 189 of FIGS. 1A and 1B, an overlapping description thereof will be omitted.

A conductive layer 330 is formed at one side of the oxide semiconductor 320 to be electrically connected to the oxide semiconductor 320. The conductive layer 330 may be referred to as a conductive member or a conductive film. Since the conductive layer 330 electrically connects the oxide semiconductor 320 to the source electrode 381 and the drain electrode 382 that will be described later, it may also be referred to as an auxiliary layer or a connecting member.

The conductive layer 330 is formed at a side surface of the oxide semiconductor 320. The conductive layer 330 may include a first conductive layer 331 formed at one side of the oxide semiconductor 320 and a second conductive layer 332 formed on the other side of the oxide semiconductor 320. The first conductive layer 331 and the second conductive layer 332 may be formed of the same material on the same plane but are not in direct contact with each other. Although the one side and the other side of the oxide semiconductor 320 are shown in a rectangular shape in FIG. 3B, the one side and the other side may be laterally inclined in other embodiments.

The conductive layer 330 may include a conductive material, and may include, for example, not only various oxidizable metals such as Al or Ti but also transparent conductive materials such as ITO or IZO.

The height of the conductive layer 330 may be substantially equal to or less than the height of the oxide semiconductor 320. The height of the conductive layer 330 is not particularly limited. However, when the height of the conductive layer 330 is greater than the height of the oxide semiconductor 320, a distance between the conductive layer 330 and the gate electrode 360 is shortened, thereby increasing the leakage current. Accordingly, the height of the conductive layer 330 may be formed to be substantially equal to or less than the height of the oxide semiconductor 320.

An area of the conductive layer 330 may be determined to meet the area design of the thin film transistor 300. The area of the conductive layer 330 is not particularly limited. However, since the conductive layer 330 is formed on the same plane as the oxide semiconductor 320, it may be difficult to implement the high-resolution display when the area of the conductive layer 330 increases. Accordingly, the area of the conductive layer 330 may be determined based on the area design of the thin film transistor 300.

The oxide semiconductor 320 used as the active layer and the source and drain electrodes 381 and 382 are electrically connected to each other via the conductive layer 330. Since the oxide semiconductor 320 has a semiconductive property and the source and drain electrodes 381 and 382 have conductive properties, a resistance occurs between the source and drain electrodes 381 and 382 and the channel region of the oxide semiconductor 320, that is, the region of the oxide semiconductor 320 overlapping the gate electrode 360, and the electric characteristic of the thin film transistor 300 may be deteriorated. In the thin film transistor 300 according to another embodiment of the present invention, the conductive layer 330 may be formed of the material allowing the resistance between the oxide semiconductor 320 and the source and drain electrodes 381 and 382 to be minimized between the channel region of the oxide semiconductor 320 and the source and drain electrodes 381 and 382, thereby enhancing the characteristics of the thin film transistor 300.

In the present embodiment, the conductive layer 330 may be positioned from the channel region of the oxide semiconductor 320 with a predetermined interval therebetween. A distance $d_1$ from the end portion 333 of the first conductive layer 331 in contact with the source electrode 381 and toward the channel region of the oxide semiconductor 320 to the source electrode-side end portion 324 of the channel region of the oxide semiconductor 320 may be equal to or less than the contact distance. In addition, a distance $d_2$ from the end portion 334 of the second conductive layer 332 in contact with the drain electrode 382 and toward the channel region of the oxide semiconductor 320 to the drain electrode-side end portion 325 of the channel region of the oxide semiconductor 320 may also be equal to or less than the contact distance.

Figure 4A:
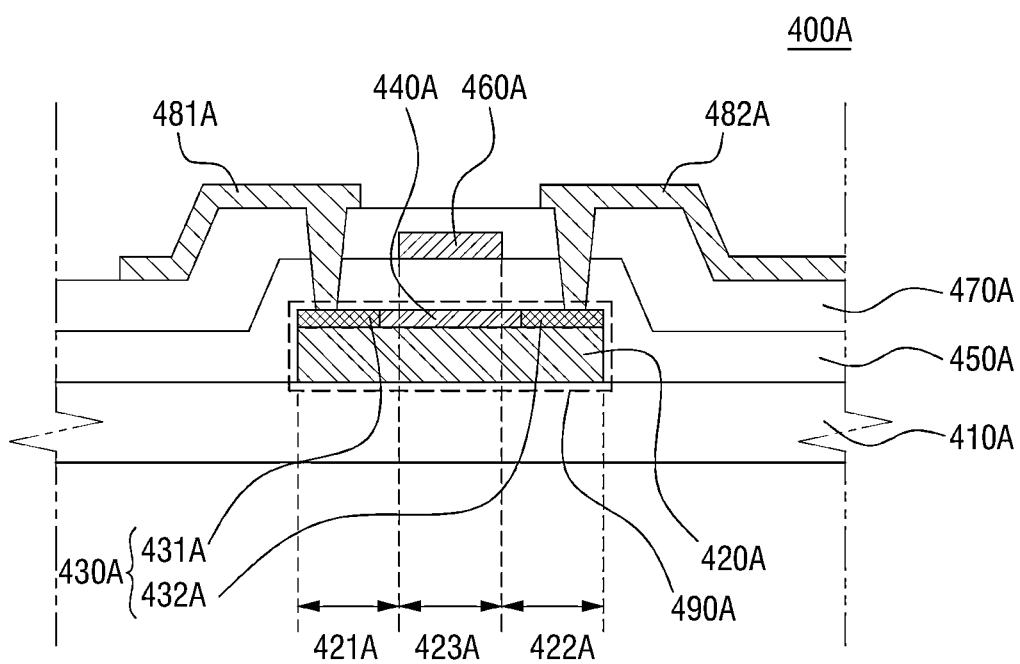
FIGS. 4A to 4C are cross-sectional views illustrating thin film transistors in accordance with various embodiments of the present invention.

FIG. 4A is a cross-sectional view illustrating a thin film transistor in accordance with another embodiment of the present invention. Since a substrate 410A, a first insulating layer 450A, a gate electrode 460A, a second insulating layer 470A, a source electrode 481A, and a drain electrode 482A are substantially the same as the substrate 110, the first insulating layer 150, the gate electrode 160, the second insulating layer 170, the source electrode 181, and the drain electrode 182 of FIGS. 1A and 1B, an overlapping description thereof will be omitted.

An active structure 490A is formed on the substrate 410A. The active structure 490A indicates a structure serving as the active layer by means of combination of one or more elements. The active structure 490A includes an oxide semiconductor 420A, and a conductive layer 430A electrically connecting the oxide semiconductor 420A and the source and drain electrodes 481A and 482A.

The oxide semiconductor 420A of the active structure 490A is formed as an active layer on the substrate 410A, and the conductive layer 430A is formed on the oxide semiconductor 420A to decrease the resistance between the oxide semiconductor 420A and the source and drain electrodes 481A and 482A. The conductive layer 430A may include a first conductive layer 431A formed on the first region 421A of the oxide semiconductor 420A and a second conductive layer 432A formed on the second region 422A of the oxide semiconductor 420A. The first conductive layer 431A may be formed to be in contact with and between the source electrode 481A and the oxide semiconductor 420A to exhibit a conductivity between the source electrode 481A and the oxide semiconductor 420A, and the second conductive layer 432A may be formed to be in contact with and between the drain electrode 482A and the oxide semiconductor 420A to exhibit a conductivity between the drain electrode 482A and the oxide semiconductor 420A. The first conductive layer 431A and the second conductive layer 432A may be formed of various oxidizable metals. Since the oxide semiconductor 420A and the conductive layer 430A are substantially the same as the oxide semiconductor 120 and the conductive layer 130 of FIGS. 1A and 1B, an overlapping description thereof will be omitted.

Figure 4B:
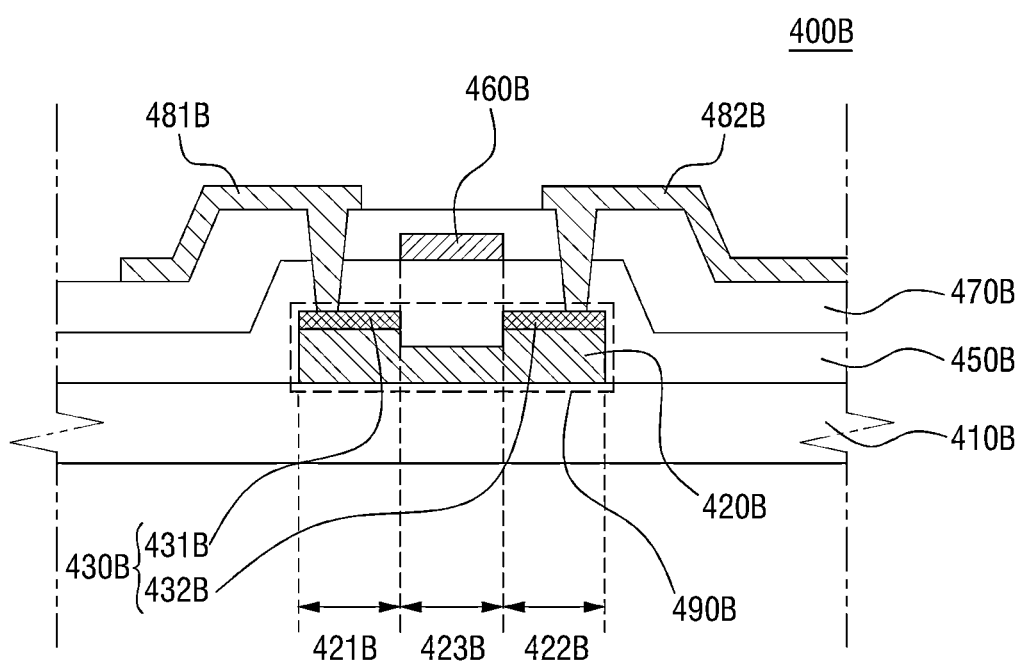

FIG. 4B is a cross-sectional view illustrating a thin film transistor in accordance with another embodiment of the present invention. Since a substrate 410B, a first insulating layer 450B, a gate electrode 460B, a second insulating layer 470B, a source electrode 481B, and a drain electrode 482B are substantially the same as the substrate 210, the first insulating layer 250, the gate electrode 260, the second insulating layer 270, the source electrode 281, and the drain electrode 282 of FIGS. 2A and 2B, an overlapping description thereof will be omitted.

An active structure 490B is formed on the substrate 410B. The active structure 490B indicates a structure serving as the active layer by means of combination of one or more elements. The active structure 490B includes an oxide semiconductor 420B, and a conductive layer 430B electrically connecting the oxide semiconductor 420B and the source and drain electrodes 481B and 482B.

The oxide semiconductor 420B of the active structure 490B is formed as an active layer on the substrate 410B, and the conductive layer 430B is formed on the oxide semiconductor 420B to decrease the resistance between the oxide semiconductor 420B and the source and drain electrodes 481B and 482B. The conductive layer 430B may include a first conductive layer 431B formed on the first region 421B of the oxide semiconductor 420B and a second conductive layer 432B formed on the second region 422B of the oxide semiconductor 420B. The first conductive layer 431B may be formed to be in contact with and between the source electrode 481B and the oxide semiconductor 420B to exhibit a conductivity between the source electrode 481B and the oxide semiconductor 420B, and the second conductive layer 432B may be formed to be in contact with and between the drain electrode 482B and the oxide semiconductor 420B to exhibit a conductivity between the drain electrode 482B and the oxide semiconductor 420B. The first conductive layer 431B and the second conductive layer 432B may be formed of transparent conductive materials. Since the oxide semiconductor 420B and the conductive layer 430B are substantially the same as the oxide semiconductor 220 and the conductive layer 230 of FIGS. 2A and 2B, an overlapping description thereof will be omitted.

Figure 4C:
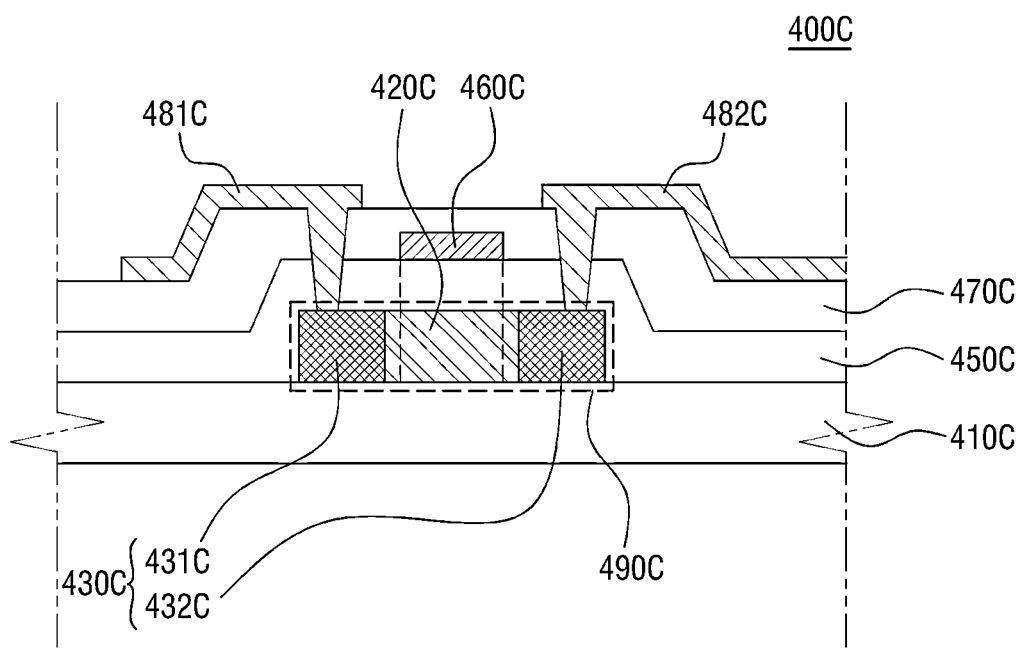

FIG. 4C is a cross-sectional view illustrating a thin film transistor in accordance with another embodiment of the present invention. Since a substrate 410C, a first insulating layer 450C, a gate electrode 460C, a second insulating layer 470C, a source electrode 481C, and a drain electrode 482C are substantially the same as the substrate 310, the first insulating layer 350, the gate electrode 360, the second insulating layer 370, the source electrode 381, and the drain electrode 382 of FIGS. 3A and 3B, an overlapping description thereof will be omitted.

An active structure 490C is formed on the substrate 410C. The active structure 490C indicates a structure serving as the active layer by means of combination of one or more elements. The active structure 490C includes an oxide semiconductor 420C, and a conductive layer 430C electrically connecting the oxide semiconductor 420C and the source and drain electrodes 481C and 482C.

The oxide semiconductor 420C of the active structure 490C is formed as an active layer on the substrate 410C, and the conductive layer 430C is formed at one side of the oxide semiconductor 420C to decrease the resistance between the oxide semiconductor 420C and the source and drain electrodes 481C and 482C. The conductive layer 430C may include a first conductive layer 431C formed at one side of the first region 421C of the oxide semiconductor 420C and a second conductive layer 432C formed at one side of the second region 422C of the oxide semiconductor 420C. The first conductive layer 431C may be formed to be in contact with and between the source electrode 481C and the oxide semiconductor 420C to exhibit a conductivity between the source electrode 481C and the oxide semiconductor 420C, and the second conductive layer 432C may be formed to be in contact with and between the drain electrode 482C and the oxide semiconductor 420C to exhibit a conductivity between the drain electrode 482C and the oxide semiconductor 420C. The first conductive layer 431C and the second conductive layer 432C are conductive materials, and may be formed of various oxidizable metals or transparent conductive materials. Since the oxide semiconductor 420C and the conductive layer 430C are substantially the same as the oxide semiconductor 320 and the conductive layer 330 of FIGS. 3A and 3B, an overlapping description thereof will be omitted.

Figure 5:
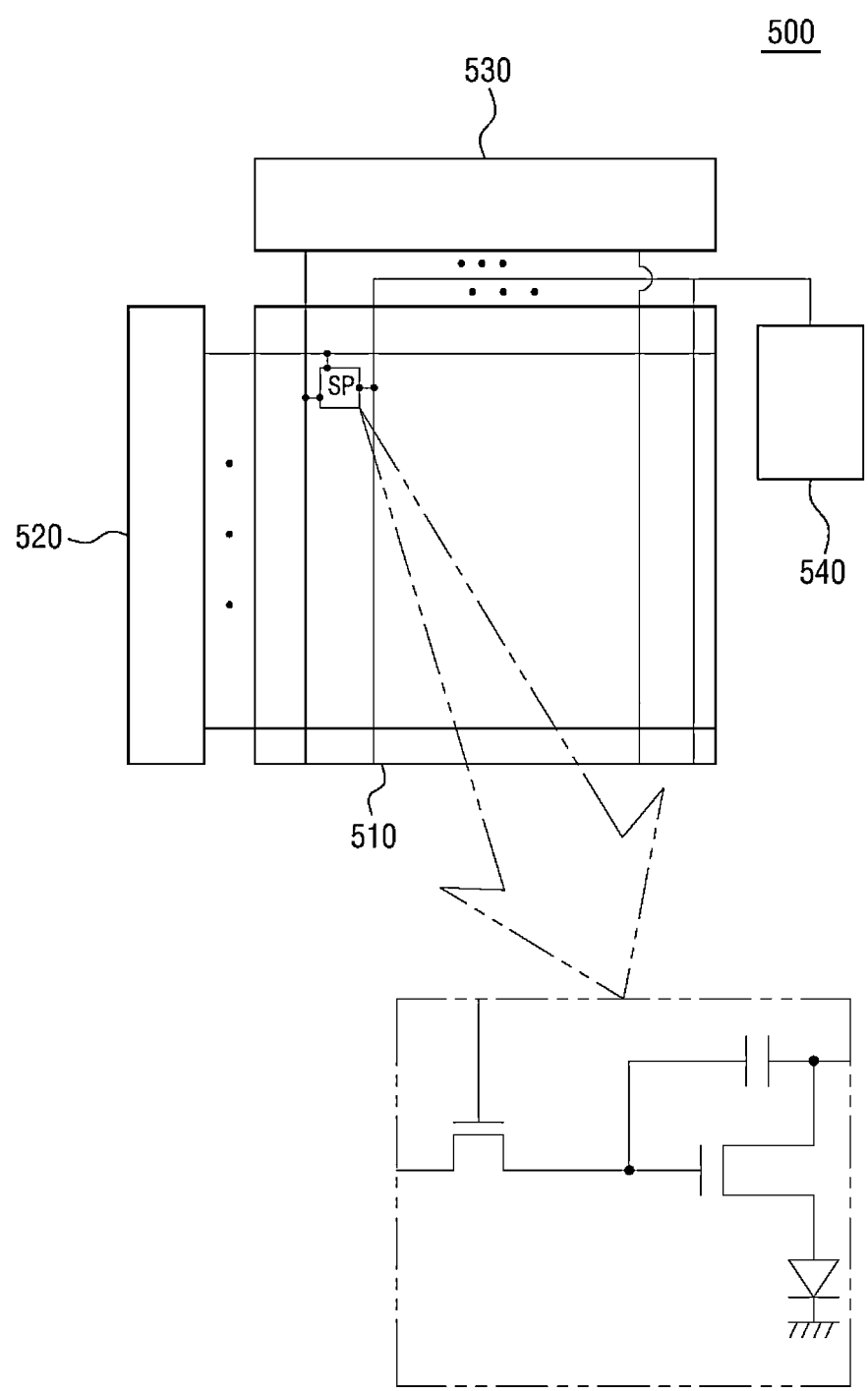
FIG. 5 is a schematic diagram illustrating a display device to which thin film transistors can be applied in accordance with various embodiments of the present invention.

FIG. 5 is a schematic diagram illustrating a display device to which thin film transistors can be applied in accordance with various embodiments of the present invention. The display device is a device for displaying images using transistors that control the operation of display elements, and includes various display devices such as an organic light emitting diode (OLED) display, a liquid crystal display (LCD), an electrophoretic display (EPD), or the like.

The display device 500 may be an OLED display, and the display device 500 includes a substrate, a plurality of thin film transistors, and an organic light-emitting element having an anode, an organic light-emitting layer and a cathode. Thin film transistors for allowing the organic light-emitting layer to emit light are included in a plurality of pixel regions SP of the display panel 510 of the display device 500. For example, as shown in FIG. 5, when a scan signal is applied from the gate driver 520 to the thin film transistors, the thin film transistors may include a switching thin film transistor delivering a data signal from the data driver 530 to a gate electrode of a driving thin film transistor, and the driving thin film transistor delivering the current delivered through the power supply 540 by the data signal delivered from the switching thin film transistor to the anode and controlling emission of the organic light-emitting layer of the corresponding pixel or subpixel by means of the current delivered to the anode. Although not shown in FIG. 5, a thin film transistor for a compensation circuit preventing abnormal driving of the display device may be included. The thin film transistors of the display device 500 may be ones of thin film transistors according to various embodiments of the present invention.

The display device may be an LCD, and the display device includes a lower substrate, an upper substrate, pixel electrodes, a common electrode, a color filter, and a liquid crystal layer interposed between the upper and lower substrate. The display device includes a plurality of pixel regions, and a plurality of thin film transistors for independently driving the plurality of pixel regions. The thin film transistors are electrically connected to the pixel electrodes formed in the lower substrate of the respective pixel regions to apply a voltage for each pixel electrode, and orient the liquid crystal by means of the electric field formed between the common electrode formed in the upper or lower substrate and the pixel electrodes formed in the respective pixel regions. The oriented liquid crystal allows light emitted from a separate light source to be selectively transmitted. The selectively transmitted light passes through the color filter disposed in the upper substrate to display an image. The thin film transistors of the display device may be ones of thin film transistors according to various embodiments of the present invention.

The display device may be an EPD, and the display device includes a lower substrate, an upper substrate, pixel electrodes, a common electrode, an optical medium layer. The optical medium layer is interposed between the upper and lower substrates, and includes a fluid and colored and charged particles dispersed in the fluid. The display device includes a plurality of pixel regions, and a plurality of thin film transistors for independently driving the pixel regions. The thin film transistors are electrically connected to the pixel electrodes formed in the lower substrate of the respective pixel regions to apply a voltage for each pixel electrode, and move the colored and charged particles by means of the electric field formed between the common electrode formed in the upper substrate and the pixel electrodes disposed in the respective pixel regions. The display device moves the colored and charged particles as described above, and colors of the colored and charged particles are displayed when the colored and charged particles are positioned in the front surface of the display device, for example, in the upper substrate. The thin film transistors of the display device may be ones of the thin film transistors according to various embodiments of the present invention.

The thin film transistors according to various embodiments of the present invention may be used in various applications. For example, the thin film transistors may be used in various display devices, and the display device 500 may be applied to not only the OLED but also the LCD, the EPD, or the like.

When the thin film transistors according to various embodiments of the present invention are used in the display device, the design of the thin film transistor may be partially changed by the kind of the display device. For example, in the case of the flexible display device, since the display device needs to be repeatedly bent or folded, various elements constituting the thin film transistor facilitating bending or folding may also be employed. In addition, in the case of the transparent display device, when the display is seen from one surface, the opposite surface of the display device needs to be visible to some extent, and sizes of various elements constituting the thin film transistor may thus be designed to be very small or the various elements constituting the thin film transistor may be formed of a transparent material.

When the thin film transistors according to various embodiments of the present invention are used in the display device, the design of the thin film transistors may be partially changed by the installation items of the display device. For example, when the display device is installed in small-sized devices or mobile devices such as a cellular phone, a smart phone, a tablet PC, or a PDA, since these devices have batteries without external power sources, elements of the thin film transistor may be designed to be suitable for the limited battery capacity. In addition, when the display device is installed in large-sized devices or fixed devices such as a television, a monitor, a screen, or an electronic display board, the external power source is supplied, and elements of the thin film transistor may thus be designed to allow the display device to implement the higher resolution under the stable supply condition of the power source.

When the thin film transistors according to various embodiments of the present invention are used in the display device, the design of the thin film transistors may be partially changed by the installation place of the display device. For example, when the display device is installed in places having a large amount of moisture such as a rest room, a basin, a shower stall, a kitchen, the thin film transistors may be designed to be formed of elements having a high resistance to moisture. In addition, when the display device is installed in positions that are apt to be exposed to external impacts such as an outer wall of a building, a building glass, a vehicle glass, or the like, the thin film transistors may be designed to be formed of elements having a high resistance to the impact or easily absorbing the impact.

The thin film transistors according to various embodiments of the present invention are not limited to the modified examples described above and may be applied to various applications, and the design of the thin film transistors may be variously changed in accordance with applications to which the thin film transistors are applied.

Figure 6:
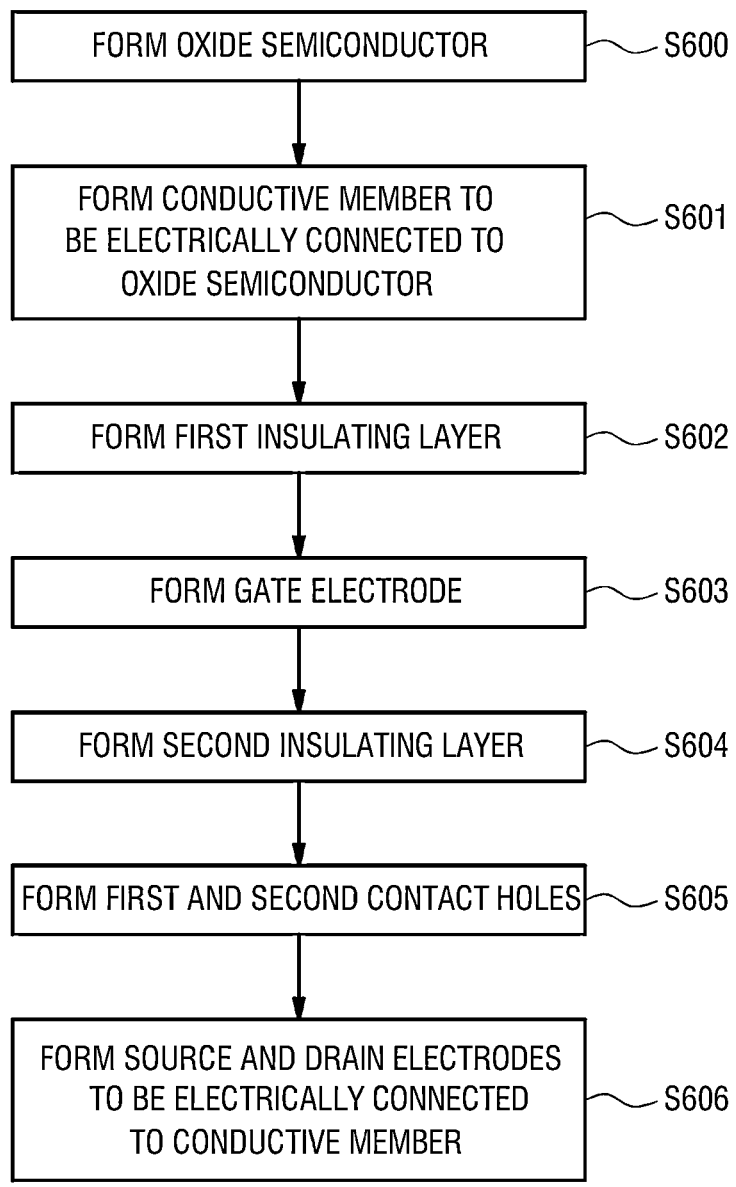
FIG. 6 is a flowchart illustrating a method of manufacturing a thin film transistor in accordance with an embodiment of the present invention.

FIG. 6 is a flowchart illustrating a method of manufacturing a thin film transistor in accordance with an embodiment of the present invention. FIGS. 7A to 7F are cross-sectional views of respective processes illustrating a method of manufacturing a thin film transistor in accordance with an embodiment of the present invention.

First, an oxide semiconductor is formed on a substrate (S600), and a conductive layer is formed to be electrically connected to the oxide semiconductor (S601). A process of forming the oxide semiconductor and the conductive layer will be described in more detail with reference to FIGS. 7A and 7B.

Figure 7A:
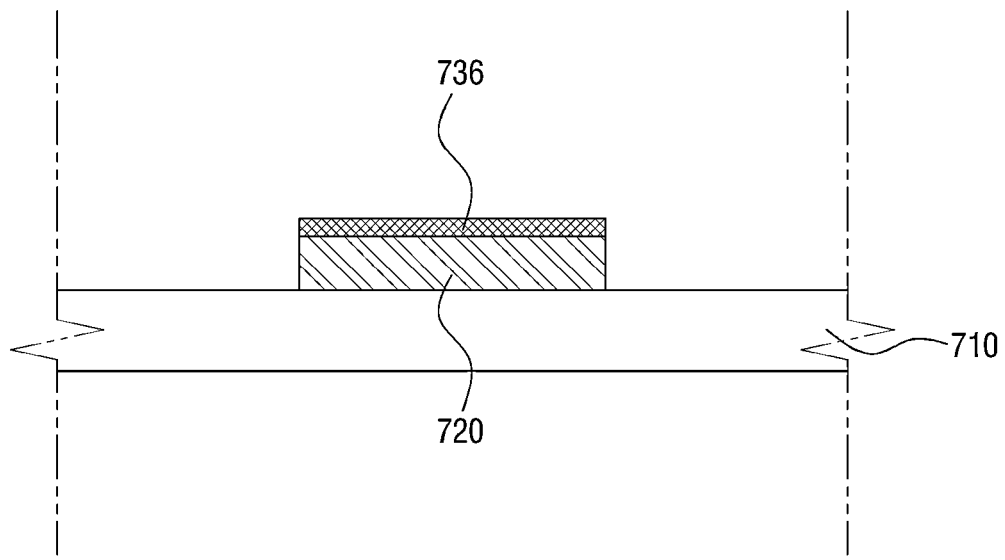
FIGS. 7A to 7F are cross-sectional views of respective processes illustrating a method of manufacturing a thin film transistor in accordance with an embodiment of the present invention.

Referring to FIG. 7A, an oxide semiconductor 720 and an intermediate conductive layer 736 may be formed on a substrate 710. Forming the oxide semiconductor 720 and the intermediate conductive layer 736 on the substrate 710 may include depositing a material for the oxide semiconductor and the intermediate conductive layer 736 on an entire surface of the substrate 710 and then selectively patterning the material for the oxide semiconductor 720 and the intermediate conductive layer 736 by means of a photolithography process.

Figure 7B:
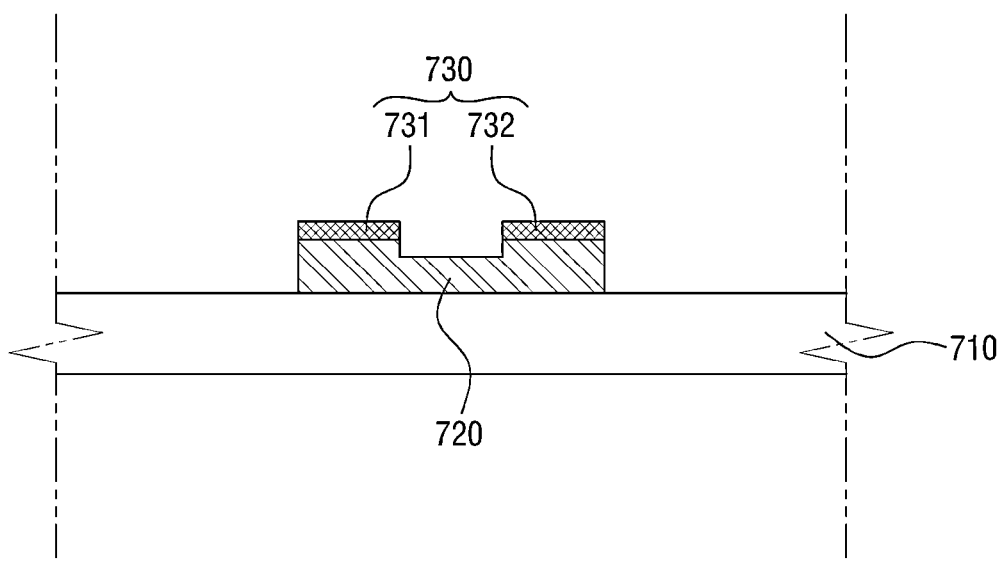

Referring to FIG. 7B, a conductive layer 730 may be formed on the oxide semiconductor 720. Forming the conductive layer 730 may include selectively patterning the only intermediate conductive layer 736 on the third region 723 of the oxide semiconductor 720 on the oxide semiconductor 720 in which the intermediate conductive layer 736 is formed using the photolithography process. The intermediate conductive layer 736 on the third region 723 of the oxide semiconductor 720 may be patterned by the back-etching process, and the conductive layer 730 may thus be divided into a first conductive layer 731 and a second conductive layer 732 formed of the same material. However, the first conductive layer 731 and the second conductive layer 732 are not in direct contact with each other.

A first insulating layer is then formed on the substrate (S602), and a gate electrode is formed on the first insulating layer (S603). A process of forming the first insulating layer and the gate electrode will be described in more detail with reference to FIG. 7C.

Figure 7C:
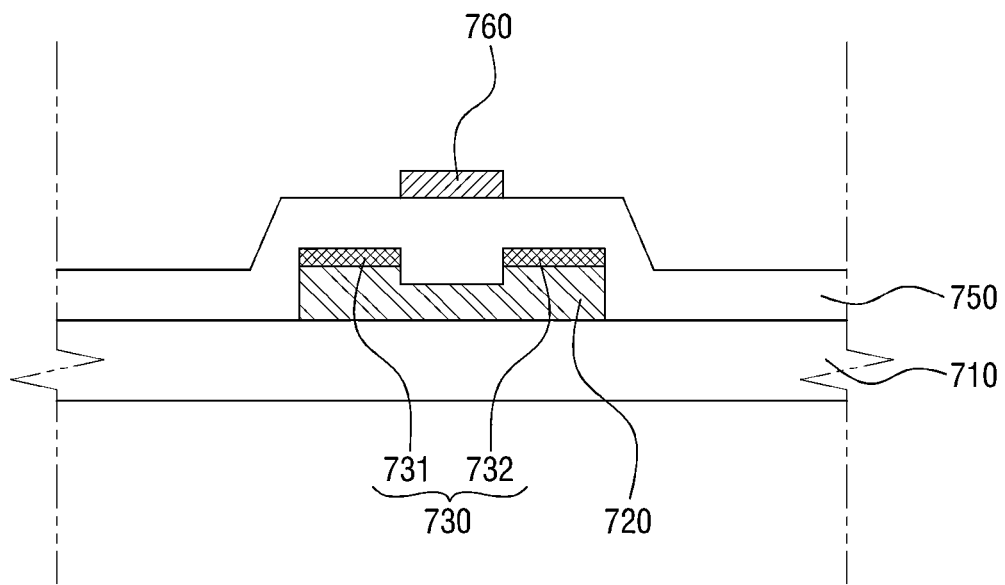

Referring to FIG. 7C, forming the first insulating layer 750 and the gate electrode 760 may include forming the first insulating layer 750 with a silicon oxide, a silicon nitride, or a stacked layer thereof on an entire surface of the substrate 710 in which the oxide semiconductor 720 and the conductive layer 730 are formed or on the third region 723 of the oxide semiconductor 720, depositing a material for the gate electrode on the entire surface of the first insulating layer 750, and then selectively patterning the material for the gate electrode by means of the photolithography process.

A second insulating layer is then formed on the substrate (S604), and a first contact hole and a second contact hole are formed in at least one of the first and second insulating layers (S605). A processing of forming the second insulating layer and the first and second contact holes will be described in more detail with reference to FIG. 7D.

Figure 7D:
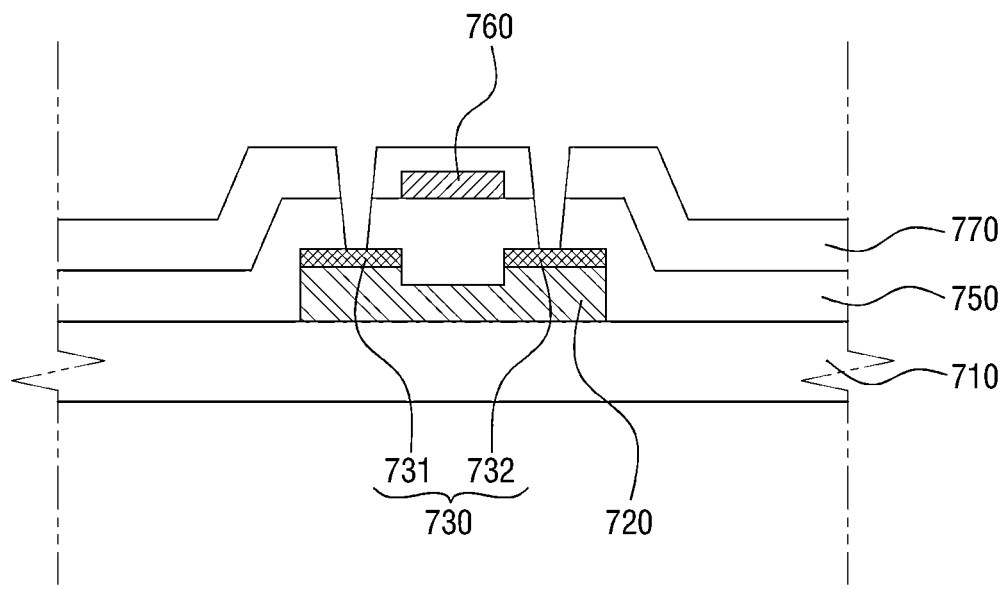

Referring to FIG. 7D, forming the second insulating layer 770 may include forming the second insulating layer 770 with a silicon oxide, a silicon nitride, or a stacked layer thereof on the entire surface of the substrate 710 in which the first insulating layer 750 and the gate electrode 760 are formed or on the gate electrode 760. Forming the first and second contact holes includes forming the first and second contact holes in at least one of the first insulating layer 750 and the second insulating layer 770. The first and second contact holes may be formed in both of the first insulating layer 750 and the second insulating layer 770 when the first insulating layer 750 and the second insulating layer 770 are formed on the entire surface of the substrate 710. However, the first and second contact holes may be formed in only one of the first insulating layer 750 and the second insulating layer 770 when any one of the first insulating layer 750 and the second insulating layer 770 is formed only in a partial region of the substrate 710, for example, only in a region overlapping the gate electrode 760.

Next, each of source and drain electrodes is formed to be electrically connected to the conductive layer via the first and second contact holes (S606). A process of forming the source and drain electrodes will be described in more detail with reference to FIG. 7E.

Figure 7E:
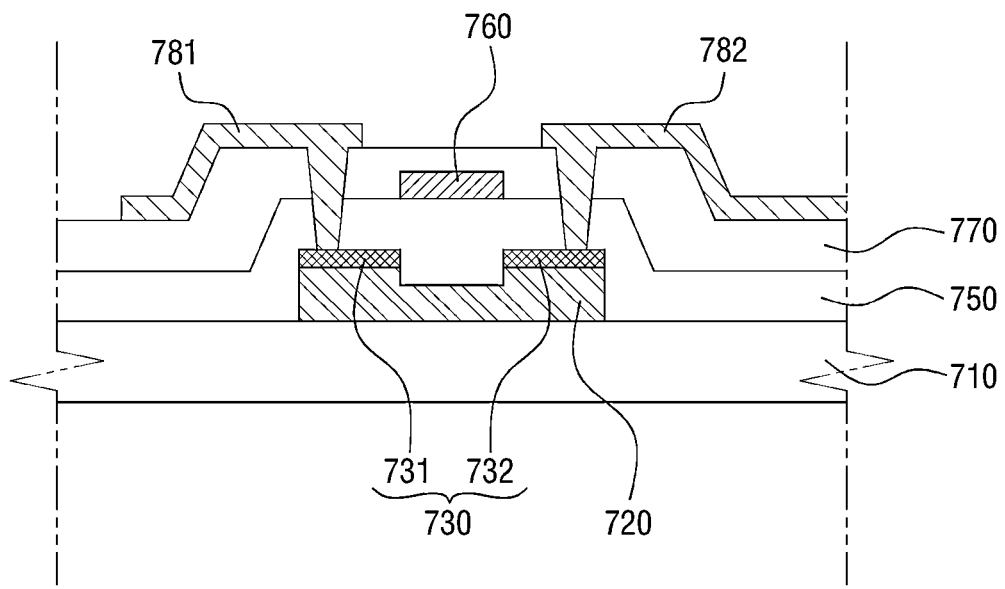

Referring to FIG. 7E, forming the source electrode 781 and the drain electrode 782 may include filling the first and second contact holes with a material for the source and drain electrodes while forming the material for the source and drain electrodes on the entire surface of the substrate 710, and selectively patterning the material for the source and drain electrodes by means of the photolithography process.

Figure 7F:
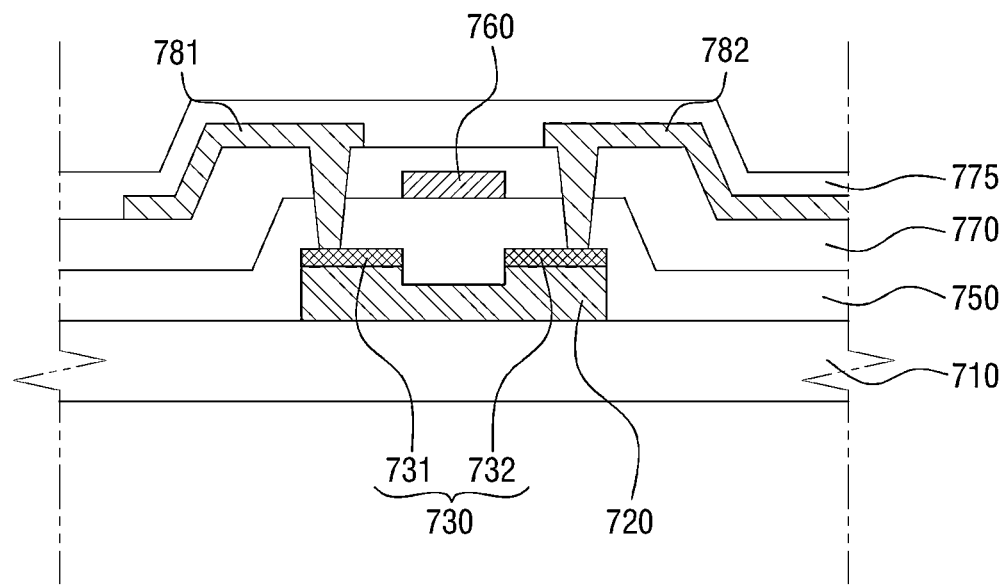

In addition, referring to FIG. 7F, a fourth insulating layer 775 may be formed on the entire surface of the substrate 710 including the source electrode 781 and the drain electrode 782. The fourth insulating layer 775 is formed on the entire surface of the substrate 710 including the source electrode 781 and the drain electrode 782, and may thus act to protect elements disposed below the fourth insulating layer 775. The fourth insulating layer 775 may be referred to as a passivation film, and may be formed of a silicon oxide, a silicon nitride, or a stacked layer thereof. However, the fourth insulating layer is not limited thereto and may be formed of various materials.

In addition, an overcoating layer may be formed on the entire surface of the substrate 710 including the source electrode 781 and the drain electrode 782. The overcoating layer is formed on the entire surface of the substrate 710 including the source electrode 781 and the drain electrode 782, and may thus protect elements disposed below the fourth insulating layer 775 and may also planarize the substrate 710 to readily allow other elements to be formed or disposed above the thin film transistor 700. The overcoating layer may be formed of at least one material of a polyacrylate resin, an epoxy resin, a phenolic resin, a polyamide resin, a polyimide rein, an unsaturated polyester resin, a poly-phenylenether resin, a poly-phenylenesulfide resin, and benzocyclobutene.

FIGS. 8A to 8G are cross-sectional views of respective processes illustrating a method of manufacturing a thin film transistor in accordance with another embodiment of the present invention.

First, an oxide semiconductor is formed on a substrate (S600), and a conductive layer is formed to be electrically connected to the oxide semiconductor (S601). A process of forming the oxide semiconductor and the conductive layer will be described in more detail with reference to FIGS. 8A to 8G.

Figure 8A:
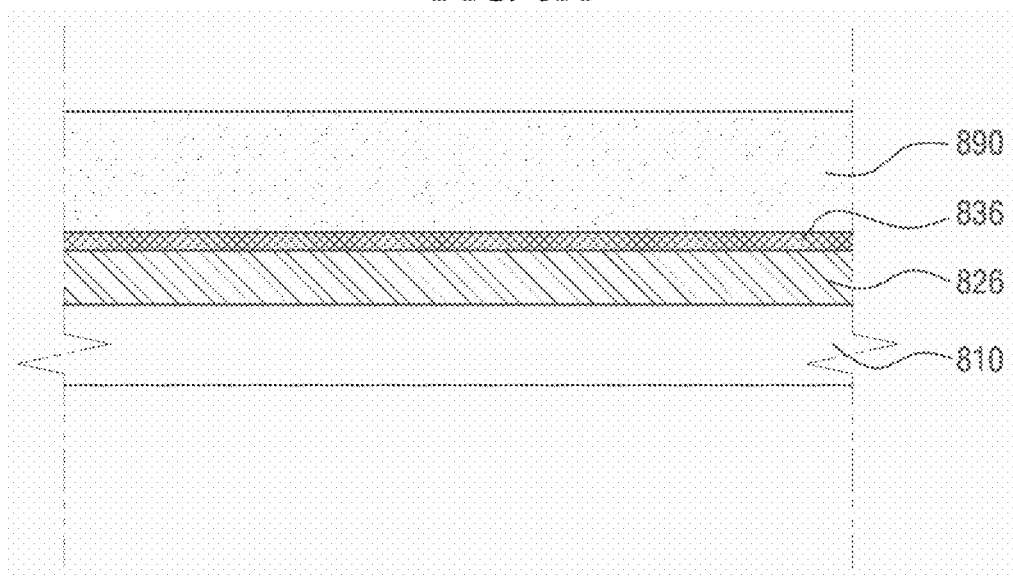
FIGS. 8A to 8G are cross-sectional views of respective processes illustrating a method of manufacturing a thin film transistor in accordance with another embodiment of the present invention.

Referring to FIG. 8A, an intermediate oxide semiconductor layer 826 and an intermediate conductive layer 836 may be deposited on an entire surface of the substrate 810, and then a photoresist 890 as a photosensitive material may be formed on the intermediate oxide semiconductor layer 826 and the intermediate conductive layer 836. It is assumed herein that the photoresist 890 is a positive type photoresist for convenience of description.

Figure 8B:
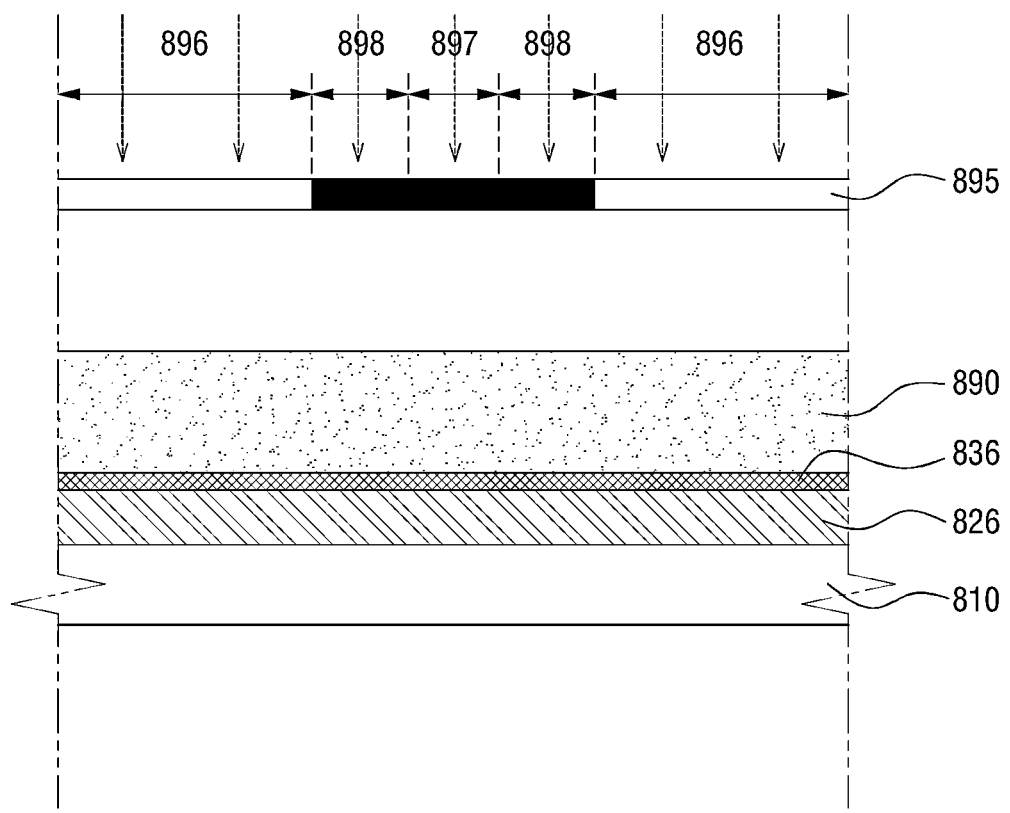
Figure 8C:
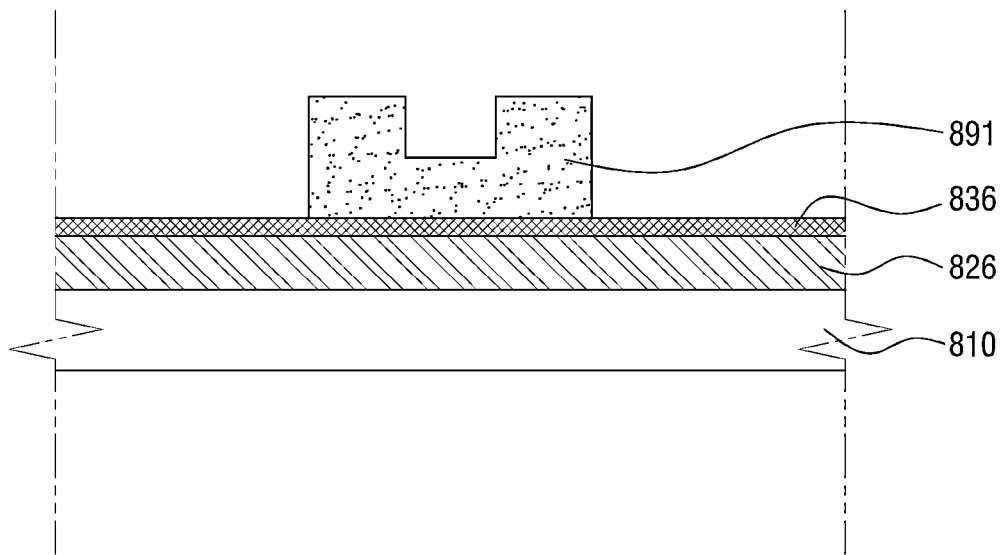

Next, referring to FIGS. 8B and 8C, a diffraction exposure mask 895 may be used to selectively expose the photoresist 890. The diffraction exposure mask 895 is a mask also referred to as a halftone mask, and indicates a mask having a different light transmittance for each region. The diffraction exposure mask 895 includes a first transmission region in which all radiated light is transmitted, a second transmission region 897 in which only some of the radiated light is transmitted, and a light-blocking region 898 in which all radiated light is blocked. Since the photoresist 890 is the positive type photoresist 890, after the diffracted and exposed photoresist 890 is developed, the photoresist 890 corresponding to the first transmission region 896 is fully removed, the photoresist 890 corresponding to the second transmission region 897 is partially removed, and the photoresist 890 corresponding to the light-blocking region 898 is not substantially removed as shown in FIG. 8C. Accordingly, first and second photoresist layers having a first height are formed in the regions corresponding to the first region 821 and the second region 822 of the oxide semiconductor 820, a third photoresist layer having a second height is formed in the region corresponding to the third region 823 of the oxide semiconductor 820, and the first height is greater than the second height. It is assumed that the positive type photoresist is used for convenience of description. However, a negative type photoresist may be employed. When the negative type photoresist is used, the exposed and developed results in the first transmission region and the light-blocking region are vice versa.

In some embodiments, a plurality of masks other than the single diffraction exposure mask 895 as described above may be used in order to form the photoresist 891. For example, a first mask having the same transmission region as the region corresponding to the first transmission region 896 of the diffraction exposure mask 895 may be used to remove the photoresist 890 in the region corresponding to the first transmission region 896 of the diffraction exposure mask 895 and a second mask having the same transmission region as the region corresponding to the second transmission region 897 of the diffraction exposure mask 895 may be used to partially remove the photoresist 890 in the region corresponding to the second transmission region 897 of the diffraction exposure mask 895 in the condition in which the photoresist 890 is formed as shown in FIG. 8B, thereby forming the photoresist 891. Alternatively, the second mask may be used first and then the first mask may be used to form the photoresist 891. However, the present invention is not limited thereto and a plurality of masks having various transmission regions may be used to form the photoresist 891.

Figure 8D:
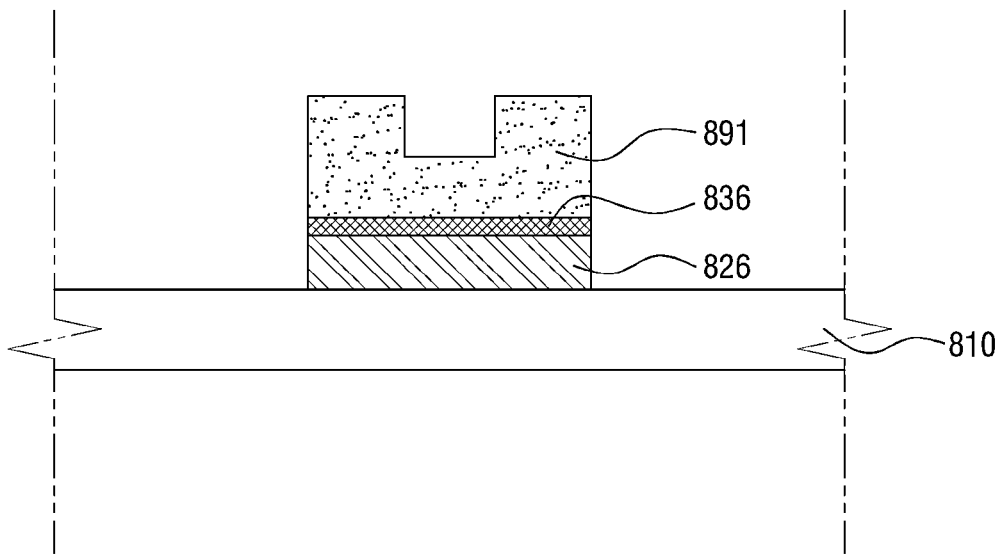

Next, referring to FIG. 8D, the photoresist 891 formed as shown in FIG. 8D may be used as a mask to selectively remove the intermediate oxide semiconductor layer 826 and the intermediate conductive layer 836, thereby forming the oxide semiconductor 820.

Figure 8E:
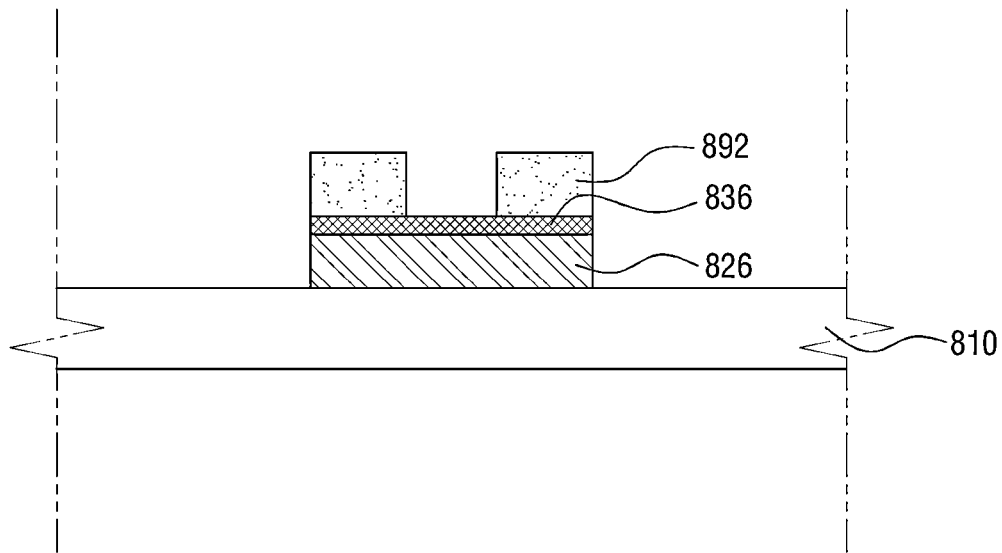
Figure 8F:
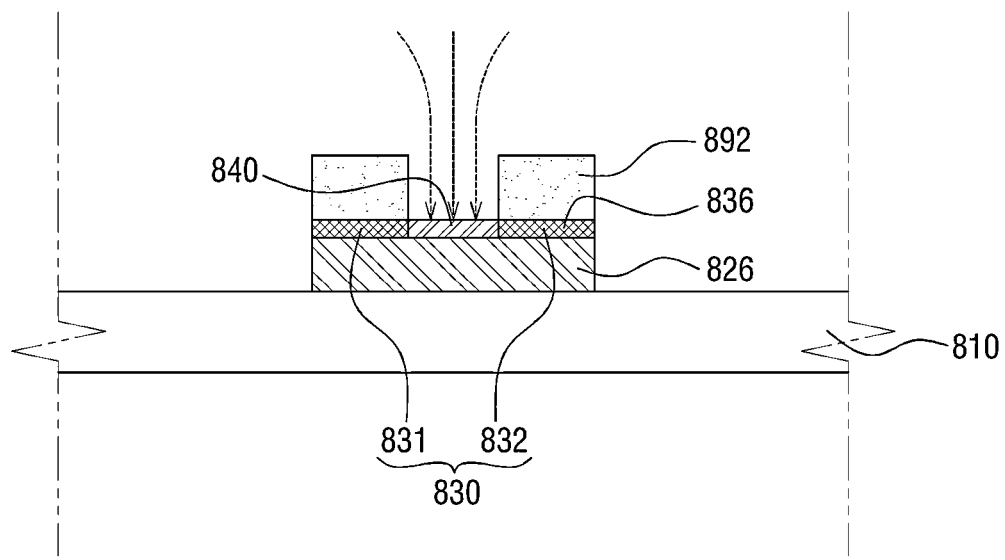
Figure 8G:
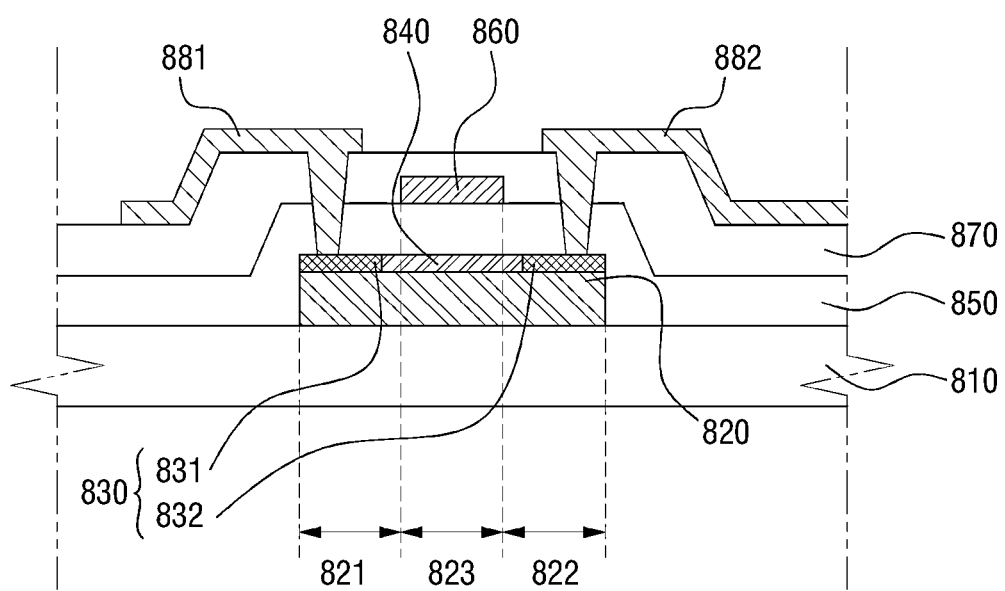

An ashing process may then be performed on the remaining photoresist 891 to decrease the height of the photoresist 892 by generally the same degree as shown in FIG. 8E, and the ashing process may be performed until the portion of the intermediate conductive layer 836 corresponding to the third region 823 (as shown in FIG. 8G) of the oxide semiconductor 820 is exposed.

Next, referring to FIG. 8F, the portion of the intermediate conductive layer 836 exposed by the ashing process and corresponding to the third region 823 of the oxide semiconductor 820 may be oxidized. Accordingly, a conductive layer 830 including a first conductive layer 831 and a second conductive layer 832, and a third insulating layer 840 between the first conductive layer 831 and the second conductive layer 832 may be formed. After the oxidization process is completed, the remaining photoresist 892 may be removed.

Next, referring to FIG. 8G, a first insulating layer 850 is formed on a substrate 810 (S602), a gate electrode 860 is formed on the first insulating layer 850 (S603), a second insulating layer 870 is formed on the substrate 810 (S604), first and second contact holes are formed in at least one of the first and second insulating layers 850 and 870 (S605), and each of source and drain electrodes 881 and 882 is formed to be electrically connected to the conductive layer 830 via the first and second contact holes (S606). Since steps S602 to S606 are substantially the same as steps S602 to S606 described with reference to FIGS. 7A to 7F, an overlapping description thereof will be omitted.

FIGS. 9A to 9D are cross-sectional views of respective processes illustrating a method of manufacturing a thin film transistor in accordance with yet another embodiment of the present invention.

First, an oxide semiconductor is formed on a substrate (S600). A process of forming the oxide semiconductor will be described in more detail with reference to FIG. 9A.

Figure 9A:
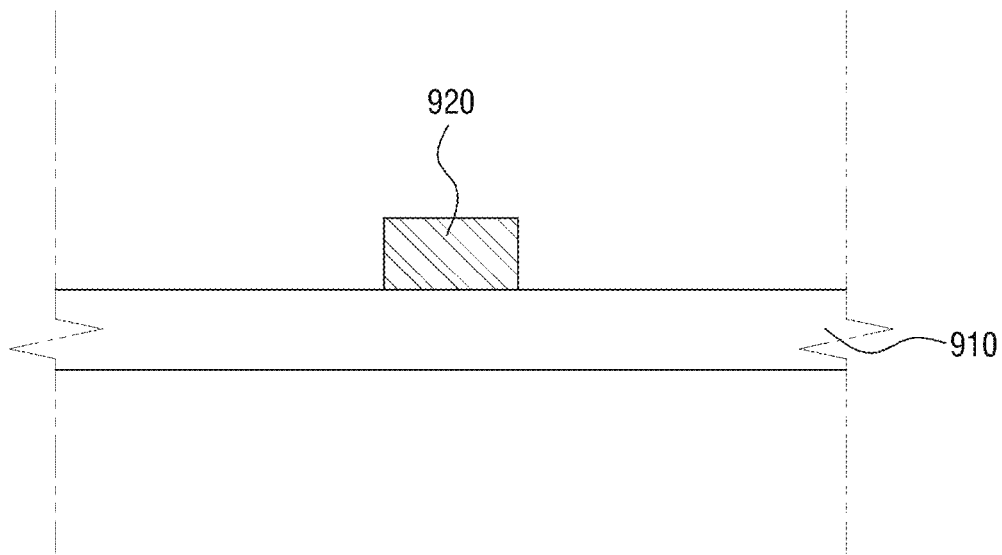
FIGS. 9A to 9D are cross-sectional views of respective processes illustrating a method of manufacturing a thin film transistor in accordance with yet another embodiment of the present invention.

Referring to FIG. 9A, forming the oxide semiconductor 920 on the substrate 910 may include depositing a material for the oxide semiconductor on an entire surface of the substrate 910, and then selectively patterning the material for the oxide semiconductor by means of the photolithography process.

A conductive layer is then formed to be electrically connected to the oxide semiconductor (S601). A process of forming the conductive layer will be described in more detail with reference to FIGS. 9B and 9C.

Figure 9B:
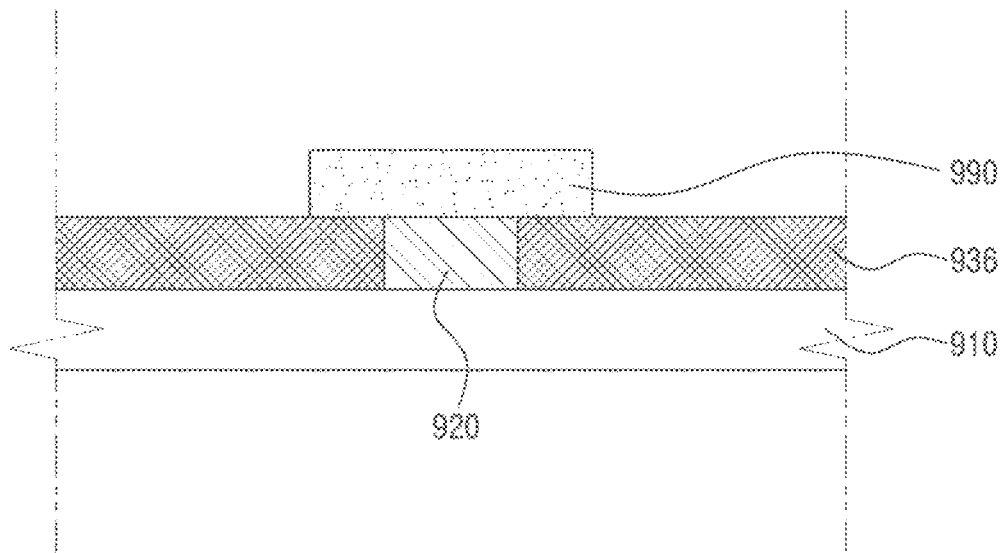

Referring to FIG. 9B, forming the conductive layer 930 may include forming an intermediate second conductive layer 936 on a region of the substrate 910 in which the oxide semiconductor 920 is not formed, and forming a photoresist 990 on a region in which the oxide semiconductor 920 and the conductive layer 930 are to be formed.

Figure 9C:
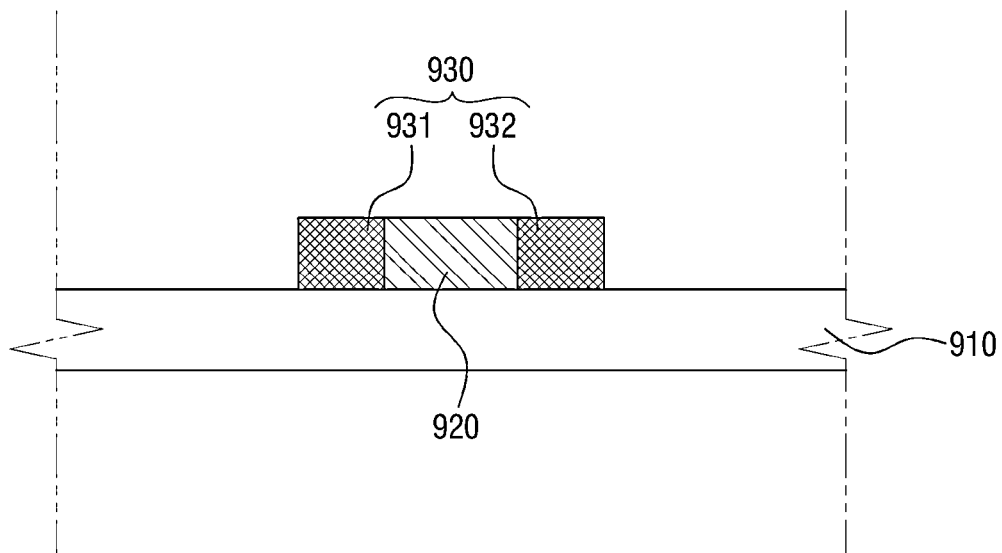

Next, referring to FIG. 9C, forming the conductive layer 930 may include selectively patterning the intermediate second conductive layer 936 using the photoresist 990 as a mask to form the conductive layer 930.

Figure 9D:
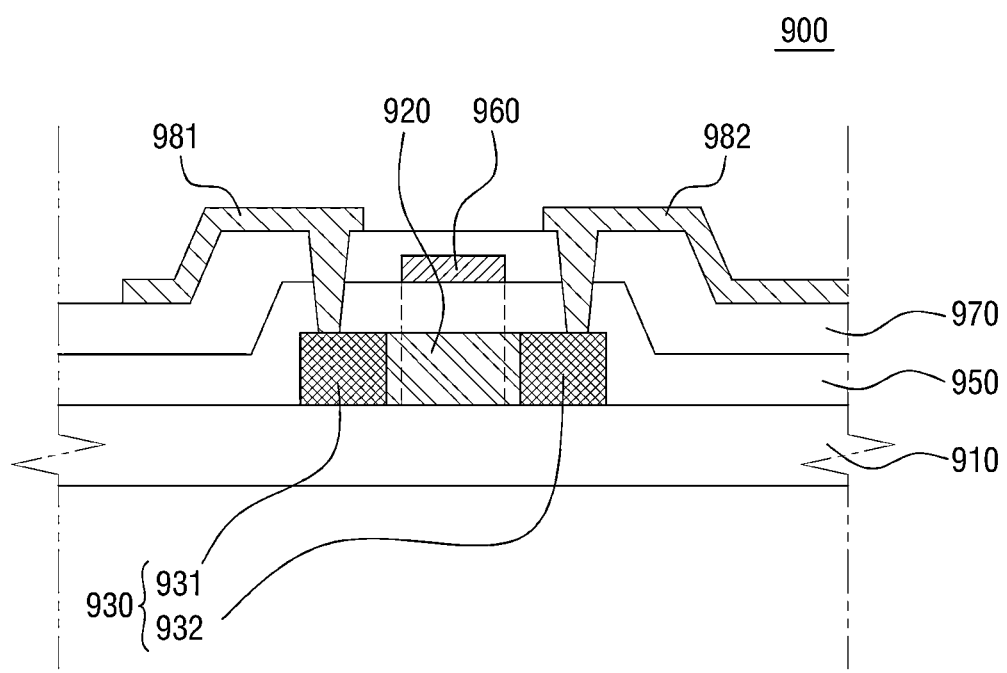

Next, referring to FIG. 9D, a first insulating layer 950 is formed on a substrate 910 (S602), a gate electrode 960 is formed on the first insulating layer 950 (S603), a second insulating layer 970 is formed on the substrate 910 (S604), first and second contact holes are formed in at least one of the first and second insulating layers 950 and 970 (S605), and source and drain electrodes are formed to be electrically connected to the conductive layer 930 via the first and second contact holes, respectively (S606). Since steps S602 to S606 are substantially the same as steps S602 to S606 described with reference to FIGS. 7A to 7F, an overlapping description thereof will be omitted.

FIG. 10 is a flowchart illustrating a method of manufacturing a thin film transistor in accordance with another embodiment of the present invention.

First, an active structure including an oxide semiconductor is formed on a substrate (S1000). The active structure indicates a structure serving as the active layer by means of combination of one or more elements. The active structure includes an oxide semiconductor, and a conductive layer electrically connecting the oxide semiconductor and source and drain electrodes. Since forming the oxide semiconductor and the source and drain electrodes included in the active structure is substantially the same as forming the oxide semiconductor and the conductive layer of FIGS. 7A to 9D, an overlapping description thereof will be omitted.

Next, a first insulating layer is formed on a substrate (S1001), a gate electrode is formed on the first insulating layer (S1002), a second insulating layer is formed on the substrate (S1003), first and second contact holes are formed in at least one of the first and second insulating layers (S1004), and source and drain electrodes are formed to be electrically connected to the active structure via the first and second contact holes, respectively (S1005). Since steps S1001 to S1005 are substantially the same as steps S602 to S606 described with reference to FIGS. 7A to 9D, an overlapping description thereof will be omitted.

According to embodiments of the present invention, at least following effects are obtained.

In one embodiment, a thin film transistor having a coplanar structure in which a resistance between an active layer and source and drain electrodes can be minimized is disclosed. In one embodiment, a thin film transistor having improved characteristics is disclosed. In one embodiment, a thin film transistor with an improved gate insulating film is disclosed. In other embodiments, a method of manufacturing the disclosed thin film transistors, and a display device including the thin film transistor can be provided.

The above-described effects according to the present invention are not intended to limit the contents used herein, and further effects may be encompassed in this specification.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A thin film transistor comprising:
   an oxide semiconductor layer having a source region, a drain region and a channel region disposed between the source and drain regions, an insulating layer, a gate electrode, a source electrode, and a drain electrode formed on a substrate in a coplanar configuration;
   a first conductive member in direct contact with the source region of the oxide semiconductor layer and in direct contact with the source electrode;
   an oxidized conductive member in direct contact with the channel region of the oxide semiconductor layer, configured to act as a double-insulating layer with the insulating layer; and
   a second conductive member in direct contact with the drain region of the oxide semiconductor layer and in direct contact with the drain electrode, wherein the first and the second conductive members are arranged to decrease resistance between the channel region of the oxide semiconductor layer and the source and drain electrodes.

2. The thin film transistor of claim 1, wherein a surface characteristic of the channel region of the oxide semiconductor layer is different from the surface characteristic of the source and drain regions of the oxide semiconductor layer.

3. The thin film transistor of claim 1, wherein a length of the oxidized conductive member is equal to or greater than a length of the gate electrode.

4. The thin film transistor of claim 1, wherein the gate electrode is arranged not to overlap with the first and the second conductive members.

5. The thin film transistor of claim 1, wherein the source electrode is in contact with the first conductive member at a first contact area and the first conductive member extends away from the first contact area towards the gate electrode, and the drain electrode is in contact with the second conductive member at a second contact area and the second conductive layer extends away from the second conductive member towards the gate electrode.

6. The thin film transistor of claim 1, wherein an end of the first conductive member that is closest to the gate electrode is spaced apart from the channel region of the oxide semiconductor layer, and wherein an end of the second conductive member that is closest to the gate electrode is spaced apart from the channel region of the oxide semiconductor layer.

7. The thin film transistor of claim 1, wherein an end of the first conductive member that is closest to the gate electrode is aligned with a first end of the channel region of the oxide semiconductor layer, and wherein an end of the second conductive member that is closest to the gate electrode is aligned with a second end of the channel region of the oxide semiconductor layer.

8. The thin film transistor of claim 3, wherein a distance between the first and second conducive members is equal to or greater than the length of the gate electrode.

9. A thin film transistor comprising:
   an oxide semiconductor layer, an insulating layer, a gate electrode, a source electrode, and a drain electrode formed on a substrate in a coplanar configuration; and
   an auxiliary member on the oxide semiconductor layer in direct contact with the oxide semiconductor layer, wherein the auxiliary member includes an oxidized portion in direct contact with the insulating layer between a first conductive portion and a second conductive portion of the auxiliary member, the first conductive portion in direct contact with the source electrode and the second conductive portion in direct contact with drain electrode, to act as a double-insulating layer with the insulating layer.

10. The thin film transistor of claim 9, wherein the oxidized portion of the auxiliary member overlaps with the gate electrode.

11. The thin film transistor of claim 9, wherein a length of the oxidized portion is equal to or greater than a length of the gate electrode.

12. The thin film transistor of claim 9, wherein a thickness of the auxiliary member is from about 30 Å to about 100 Å.

13. The thin film transistor of claim 1, wherein the double-insulating layer comprising the oxidized conductive member and the first insulating layer is disposed between the oxide semiconductor and the gate electrode to enhance the insulating property and decrease the occurrence of a leakage current.

14. The thin film transistor of claim 13, wherein the oxidized conductive member at least partially overlaps with the gate electrode.

* * * * *